United States Patent
Reusswig et al.

(10) Patent No.: US 10,026,488 B2
(45) Date of Patent: Jul. 17, 2018

(54) NON-VOLATILE MEMORY WITH READ DISTURB DETECTION FOR OPEN BLOCKS

(71) Applicant: SANDISK TECHNOLOGIES LLC, Plano, TX (US)

(72) Inventors: Phil Reusswig, Mountain View, CA (US); Joanna Lai, San Jose, CA (US); Deepak Raghu, San Jose, CA (US); Grishma Shah, Milpitas, CA (US); Nian Niles Yang, Mountain View, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 15 days.

(21) Appl. No.: 15/240,188

(22) Filed: Aug. 18, 2016

(65) Prior Publication Data

US 2018/0053562 A1 Feb. 22, 2018

(51) Int. Cl.
*G11C 16/34* (2006.01)
*G06F 3/06* (2006.01)
*G06F 11/10* (2006.01)
*G11C 29/52* (2006.01)
*G11C 16/22* (2006.01)
*G11C 16/26* (2006.01)

(52) U.S. Cl.
CPC ......... *G11C 16/3431* (2013.01); *G06F 3/064* (2013.01); *G06F 3/0619* (2013.01); *G06F 3/0653* (2013.01); *G06F 3/0685* (2013.01); *G06F 11/1068* (2013.01); *G11C 16/22* (2013.01); *G11C 16/26* (2013.01); *G11C 29/52* (2013.01)

(58) Field of Classification Search
CPC ...... G06F 3/0653; G06F 3/0619; G06F 3/064; G06F 11/1068; G06F 11/1072; G11C 16/22; G11C 16/26; G11C 16/3431; G11C 29/42; G11C 29/52
See application file for complete search history.

(56) References Cited

U.S. PATENT DOCUMENTS

| | | |
|---|---|---|
| 5,574,684 A | 11/1996 | Tomeoda |
| 7,808,831 B2 | 10/2010 | Mokhlesi |
| 7,817,469 B2 | 10/2010 | Avraham |
| 7,852,683 B2 | 12/2010 | Lutze |
| 7,859,932 B2 | 12/2010 | Mokhlesi |

(Continued)

OTHER PUBLICATIONS

Cai et al., Read disturb errors in MLC NAND flash memory: characterization, mitigation, and recovery, 2015, Carnegie Mellon (google.com), pp. 1 to 12.*

(Continued)

*Primary Examiner* — Shelly A Chase
(74) *Attorney, Agent, or Firm* — Vierra Magen Marcus LLP

(57) ABSTRACT

A non-volatile memory system includes technology for detecting read disturb in open blocks. In one embodiment, the system determines whether a particular block of non-volatile memory cells has been subjected to a minimum number of open block read operations and performs sensing operations for memory cells connected to an open word line of the particular block. The number of errors in the sensed data is determined. If the number of errors is greater than a limit, then the system takes an action to mitigate the read disturb.

16 Claims, 18 Drawing Sheets

(56) References Cited

U.S. PATENT DOCUMENTS

| | | |
|---|---|---|
| 8,310,870 B2 | 11/2012 | Dutta |
| 8,914,696 B2 | 12/2014 | Chen |
| 8,972,652 B2 | 3/2015 | Kim |
| 8,982,653 B2 | 3/2015 | Nurminen |
| 9,019,771 B2 | 4/2015 | Lung |
| 9,612,957 B2* | 4/2017 | Brokhman .......... G06F 12/0246 |
| 9,613,687 B2* | 4/2017 | Kim .................... G11C 11/5642 |
| 2011/0038203 A1 | 2/2011 | Camp |
| 2012/0233391 A1 | 9/2012 | Frost |
| 2013/0346805 A1 | 12/2013 | Sprouse |
| 2015/0278014 A1* | 10/2015 | Chu .................... G06F 11/1068 |
| | | 714/764 |

OTHER PUBLICATIONS

Sun et al., Quantifying reliability of solid state storage from multiple aspects , 2011, Fusion-IO (google.com) pp. 1 to 8.*

Tang, et al., "Dependence of Electrons Loss Behavior on the Nitride Thickness and Temperature for Charge Trap Flash Memory Applications," Transactions on Electrical and Electronic Materials, vol. 15, No. 5, pp. 245-248, Oct. 25, 2014.

Yang, et al., "System for Handling Erratic Word Lines for Non-volatile Memory," U.S. Appl. No. 14/918,796, filed Oct. 21, 2015.

Filing Receipt dated Nov. 4, 2015, U.S. Appl. No. 14/918,796, filed Oct. 21, 2015.

Ghai, et al., "Non-volatile Memory Within Field Failure Prediction Using Leakage Detection," U.S. Appl. No. 15/141,507, filed Apr. 28, 2016.

Filing Receipt dated May 13, 2016, U.S. Appl. No. 15/141,507, filed Apr. 28, 2016.

* cited by examiner

|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |

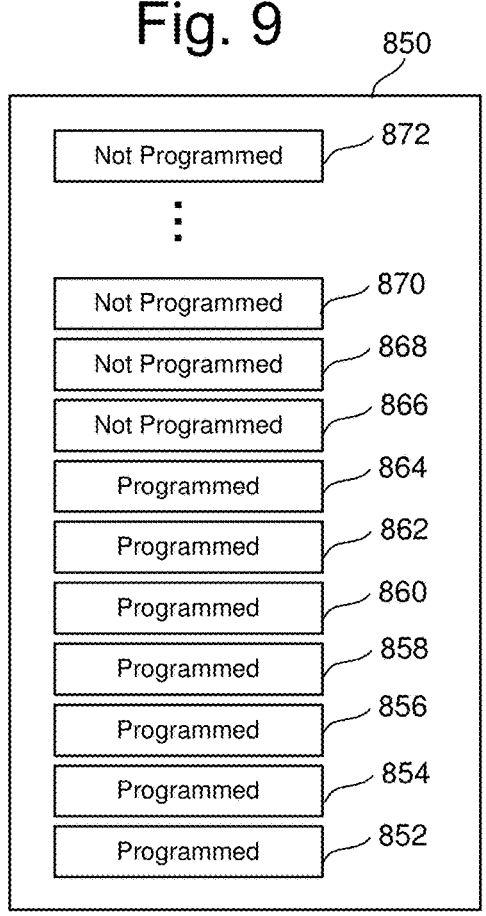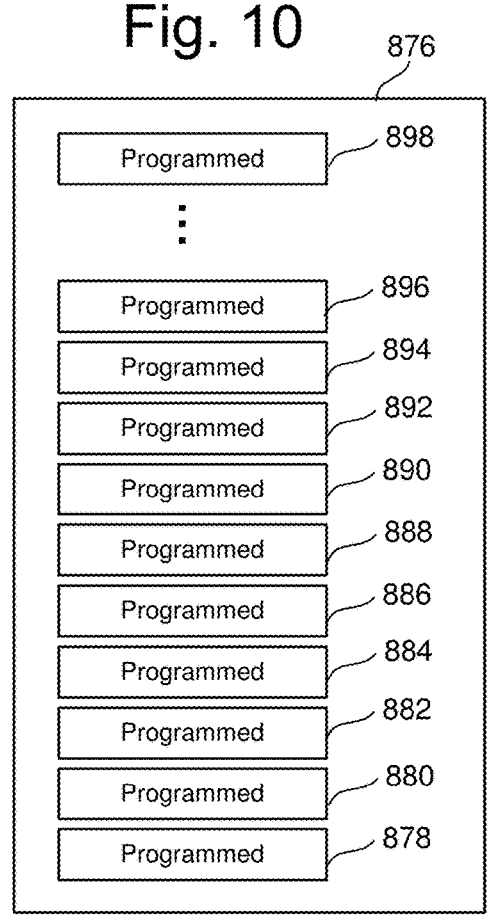

NON-VOLATILE MEMORY WITH READ DISTURB DETECTION FOR OPEN BLOCKS

BACKGROUND

Semiconductor memory is widely used in various electronic devices such as cellular telephones, digital cameras, personal digital assistants, medical electronics, mobile computing devices, non-mobile computing devices and data servers. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory), Electrically Erasable Programmable Read-Only Memory (EEPROM), and others.

When a memory system is deployed in an electronic device, the memory system can be used to program data, read data and/or erase data. It is important that once data is stored in a memory system, the data is retained without uncorrectable errors.

BRIEF DESCRIPTION OF THE DRAWINGS

Like-numbered elements refer to common components in the different figures.

FIG. 9 depicts an open block.

FIG. 10 depicts a closed block.

DETAILED DESCRIPTION

Many memory systems include a large amount of non-volatile memory cells arranged in a two dimensional (2D) or three dimensional (3D) memory structure that includes word lines and bit lines (or other types of control lines). The memory cells are arranged into groups that are referred to as a block. Often, a block of memory cells share a common set of word lines and bit lines. In some embodiments, memory cells are erased as a block. Read operations are typically performed by applying a compare voltage a word line (or other control line) selected for reading and applying other voltages on unselected word lines (or other control lines). Because the unselected word lines (or other types of control lines) receive a positive voltage, memory cells connected to the unselected lines during a read operation will receive a voltage on their control gate which over time may cause electrons to move, thereby, changing the threshold voltage of those memory cells. This behavior is called Read Disturb.

Often, but not always, data is programmed in units of pages. A word line connected to many memory cells in a common block may host one or multiple pages. A page that has been programmed is referred to as a closed page. A page that has all its bits in the erased condition (not programmed since the last erase operation) is an open page. Similarly, a word line is closed if all pages on that word line have been subjected to programming and a word line is open if all memory cells connected to the word line are in (or supposed to be in) the erased condition. A block is an open block if one or more of the word lines in that block are closed and if one or more of the word lines in that block are open. A block is closed if all word lines in that block are closed.

It has been determined that reading memory cells connected to closed word lines in an open block can cause read disturb to memory cells connected to open word lines of the same block. Therefore, technology is proposed for detecting read disturb in open blocks. If the number of errors caused by the read disturb is greater than a limit, then the system takes an action to mitigate the read disturb.

One embodiment includes determining whether a particular block of non-volatile memory cells has been subjected to a minimum number of open block read operations. If so, memory cells connected to an open word line of the particular block are sensed (or read) in order to determine a number of errors in the memory cells connected to the open word line. For example, the system determines how many bits or memory cells are no longer erased. If the number of errors is greater than a limit, then the system takes an action to protect the data of the particular block. For example, if the memory cells connected to the open word line are not properly in the erased condition, future programming on that word line may lead to errors. Additionally, read disturb on the open word line may be an indicator of read disturb on closed word lines.

Figure 1:
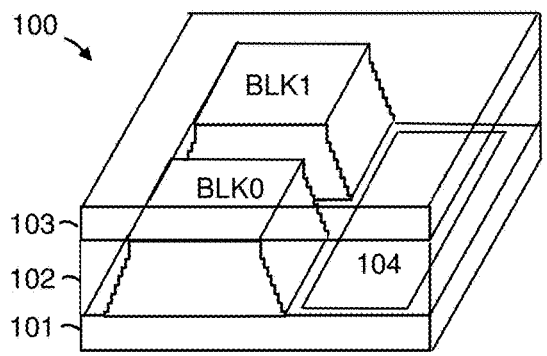
FIG. 1 is a perspective view of a 3D stacked non-volatile memory device.

FIGS. 1-4F describe one example of a memory system that can be used to implement the technology proposed herein. FIG. 1 is a perspective view of a three dimensional (3D) stacked non-volatile memory device. The memory device 100 includes a substrate 101. On and above the substrate are example blocks BLK0 and BLK1 of memory cells (non-volatile storage elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the memory device. In an upper region 103 of the memory device, one or more upper metal layers are patterned in conductive paths to carry signals of the circuits. Each block comprises a stacked area of memory cells, where alternating levels of the stack represent word lines. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

Figure 2:
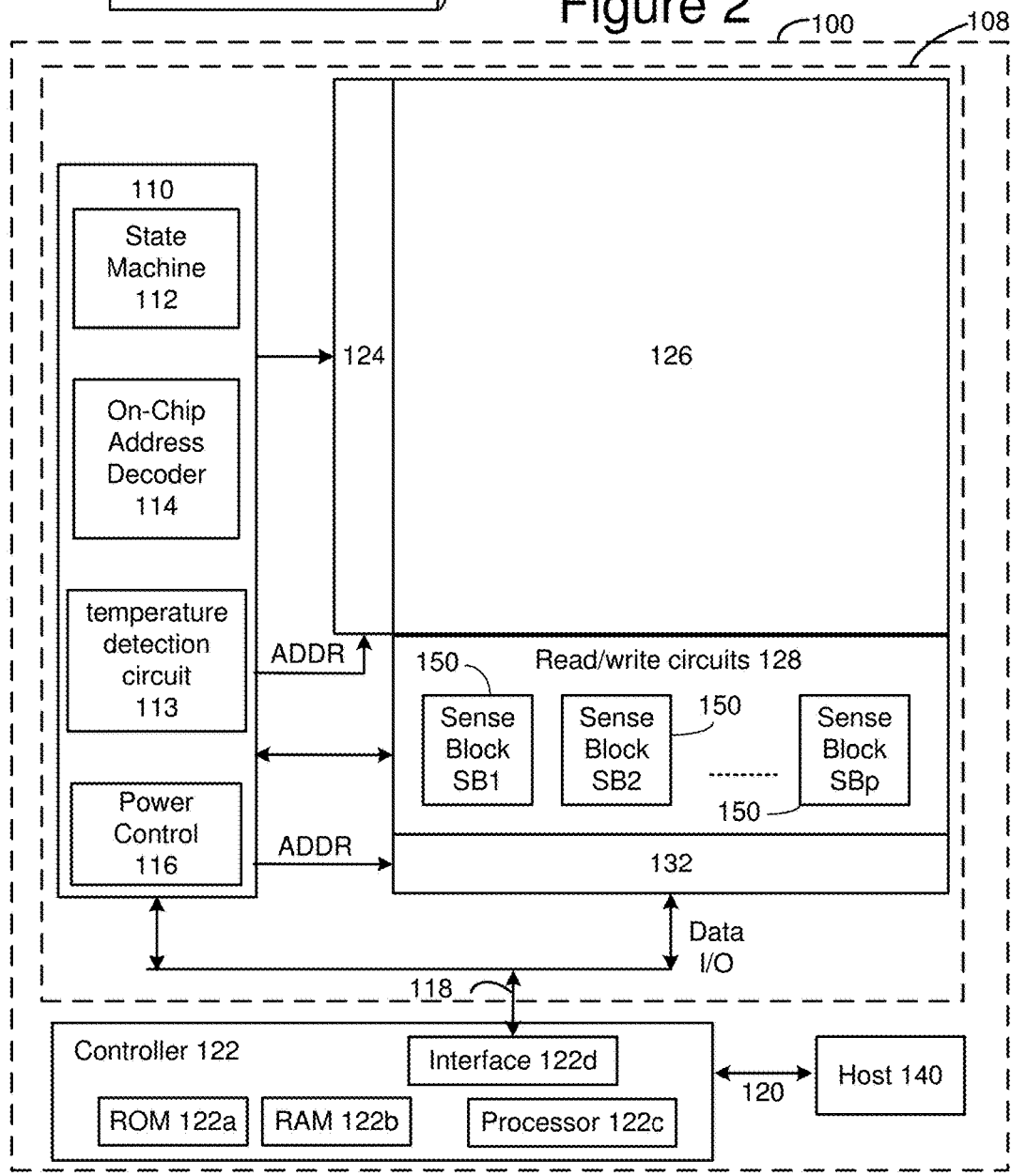
FIG. 2 is a functional block diagram of a memory device such as the 3D stacked non-volatile memory device 100 of FIG. 1.

FIG. 2 is a functional block diagram of an example memory device such as the 3D stacked non-volatile memory device 100 of FIG. 1. The components depicted in FIG. 2 are electrical circuits. Memory device 100 includes one or more memory die 108. Each memory die 108 includes a three dimensional memory structure 126 of memory cells (such as, for example, a 3D array of memory cells), control circuitry 110, and read/write circuits 128. In other embodiments, a two dimensional array of memory cells can be used. Memory structure 126 is addressable by word lines via a row decoder 124 and by bit lines via a column decoder 132. The read/write circuits 128 include multiple sense blocks 150 including SB1, SB2, . . . , SBp (sensing circuitry) and allow a page of memory cells to be read or programmed in parallel. In some systems, a Controller 122 is included in the same memory device 100 (e.g., a removable storage card) as the one or more memory die 108. However, in other systems, the Controller can be separated from the memory die 108. In some embodiments the Controller will be on a different die than the memory die. In some embodiments, one Controller 122 will communicate with multiple memory die 108. In other embodiments, each memory die 108 has its own Controller. Commands and data are transferred between the host 140 and Controller 122 via a data bus 120, and between Controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Control circuitry 110 cooperates with the read/write circuits 128 to perform memory operations (e.g., erase, program, read, and others) on memory structure 126, and includes a state machine 112, an on-chip address decoder 114, and a power control module 116. The state machine 112 provides die-level control of memory operations. Temperature detection circuit 113 is configured to detect temperature, and can be any suitable temperature detection circuit known in the art. In one embodiment, state machine 112 is programmable by the software. In other embodiments, state machine 112 does not use software and is completely implemented in hardware (e.g., electrical circuits). In one embodiment, control circuitry 110 includes registers, ROM fuses and other storage devices for storing default values such as base voltages and other parameters.

The on-chip address decoder 114 provides an address interface between addresses used by host 140 or Controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, temperature detection circuit 113, power control module 116, sense blocks 150, read/write circuits 128, and Controller 122 can be considered one or more control circuits (or a managing circuit) that performs the functions described herein.

The (on-chip or off-chip) Controller 122 (which in one embodiment is an electrical circuit) may comprise one or more processors 122c, ROM 122a, RAM 122b and a Memory Interface 122d, all of which are interconnected. One or more processors 122c is one example of a control circuit. Other embodiments can use state machines or other custom circuits designed to perform one or more functions. The storage devices (ROM 122a, RAM 122b) comprises code such as a set of instructions, and the processor 122c is operable to execute the set of instructions to provide the functionality described herein. Alternatively or additionally, processor 122c can access code from a storage device in the memory structure, such as a reserved area of memory cells connected to one or more word lines. Memory interface 122d, in communication with ROM 122a, RAM 122b and processor 122c, is an electrical circuit (electrical interface) that provides an electrical interface between Controller 122 and one or more memory die 108. For example, memory interface 122d can change the format or timing of signals, provide a buffer, isolate from surges, latch I/O, etc. Processor 122c can issue commands to control circuitry 110 (or any other component of memory die 108) via Memory Interface 122d. In one embodiment, processor 122c can access code from ROM 122a or RAM 122b to detect read disturb in open blocks and take action to mitigate the read disturb, including determining that a particular block of non-volatile memory cells is an open block and has been subjected to a minimum number of read operations; reading memory cells connected to an open word line of the particular block and identifying unerased bits; and copying data for the particular block to a new block if there are more than a minimum number of unerased bits for the open word line.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array.

By way of non-limiting example, in a three dimensional NAND memory array, the memory elements may be coupled together to form vertical NAND strings that traverse across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
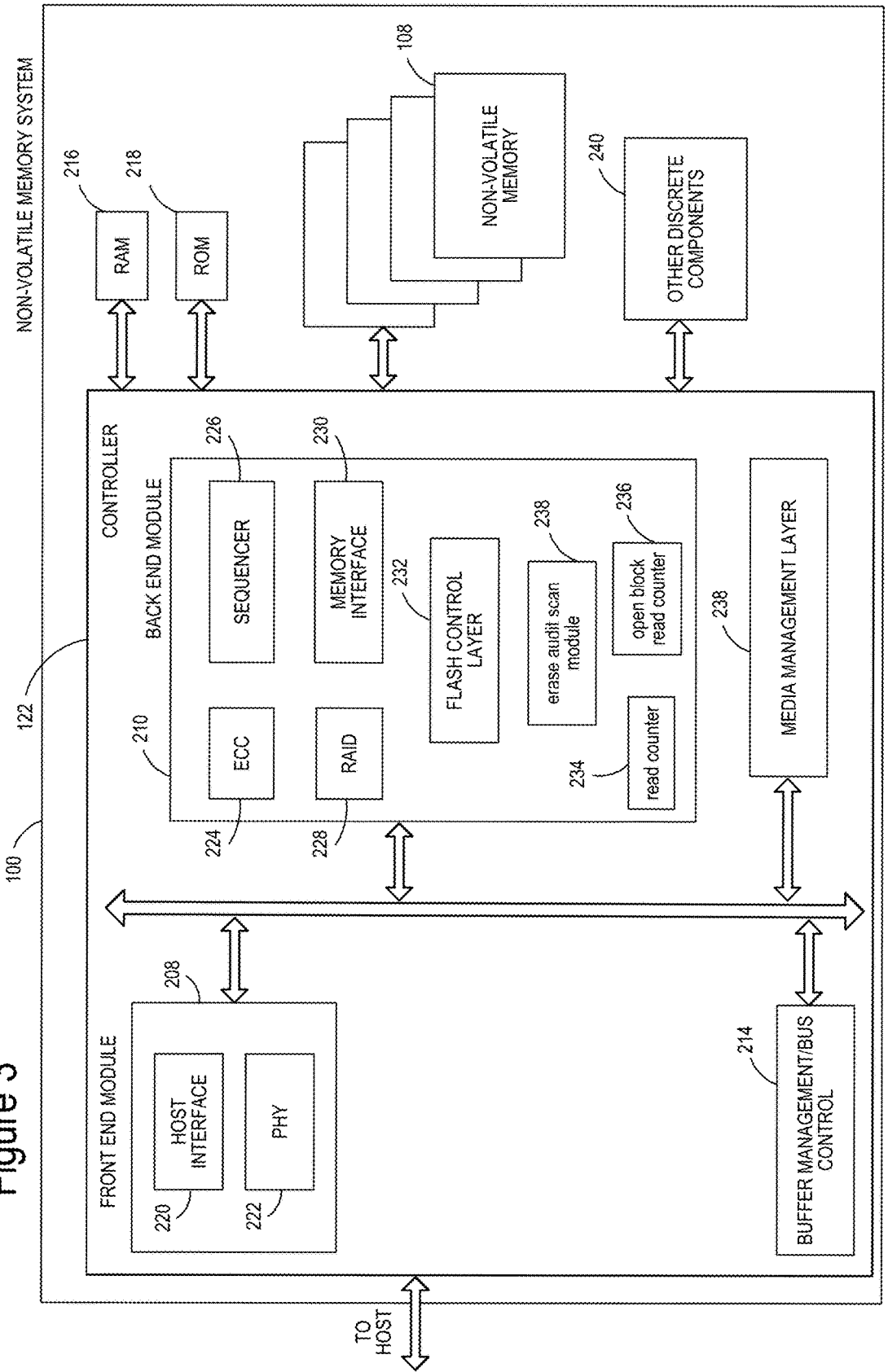
FIG. 3 is a block diagram depicting one embodiment of a Controller.

FIG. 3 is a block diagram of example memory system 100, depicting more details of Controller 122. As used herein, a flash memory Controller is a device that manages data stored on flash memory and communicates with a host, such as a computer or electronic device. A flash memory Controller can have various functionality in addition to the specific functionality described herein. For example, the flash memory Controller can format the flash memory to ensure the memory is operating properly, map out bad flash memory cells, and allocate spare memory cells to be substituted for future failed cells. Some part of the spare cells can be used to hold firmware to operate the flash memory Controller and implement other features. In operation, when a host needs to read data from or write data to the flash memory, it will communicate with the flash memory Controller. If the host provides a logical address to which data is to be read/written, the flash memory Controller can convert the logical address received from the host to a physical address in the flash memory. (Alternatively, the host can provide the physical address). The flash memory Controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between Controller 122 and non-volatile memory die 108 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the flash memory may be embedded within the host, such as in the form of a solid state disk (SSD) drive installed in a personal computer.

In some embodiments, non-volatile memory system 100 includes a single channel between Controller 122 and non-volatile memory die 108, the subject matter described herein is not limited to having a single memory channel. For example, in some memory system architectures, 2, 4, 8 or more channels may exist between the Controller and the memory die, depending on Controller capabilities. In any of the embodiments described herein, more than a single channel may exist between the Controller and the memory die, even if a single channel is shown in the drawings.

As depicted in FIG. 3, Controller 112 includes a front end module 208 that interfaces with a host, a back end module 210 that interfaces with the one or more non-volatile memory die 108, and various other modules that perform functions which will now be described in detail.

The components of Controller 122 depicted in FIG. 3 may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for Controller 122 to perform the functions described herein. The architecture depicted in FIG. 3 is one example implementation that may (or may not) use the components of Controller 122 depicted in FIG. 2 (i.e. RAM, ROM, processor, interface).

Referring again to modules of the Controller 122, a buffer manager/bus control 214 manages buffers in random access memory (RAM) 216 and controls the internal bus arbitration of Controller 122. A read only memory (ROM) 218 stores system boot code. Although illustrated in FIG. 3 as located separately from the Controller 122, in other embodiments one or both of the RAM 216 and ROM 218 may be located within the Controller. In yet other embodiments, portions of RAM and ROM may be located both within the Controller 122 and outside the Controller. Further, in some implementations, the Controller 122, RAM 216, and ROM 218 may be located on separate semiconductor die.

Front end module 208 includes a host interface 220 and a physical layer interface (PHY) 222 that provide the electrical interface with the host or next level storage Controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction Controller (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210. One embodiment includes a read counter 234 and an open block read counter 236. Read counter 234 (a software module or a dedicated hardware circuit) is used to count how many times each block (or each word line) has been subjected to a read operation. Open block read counter 236 (a software module or a dedicated hardware circuit) is used to count how many times each block (or each word line) has been subjected to an open block read operation (e.g., a read operation while the block is an open block). Erase audit scan module 238 (a software module or a dedicated hardware circuit) is used to manage the process for detecting read disturb in open blocks and taking action to mitigate the read disturb. In one embodiment, erase audit scan module 238 determines that a particular block of non-volatile memory cells is an open block and has been subjected to a minimum number of read operations, reads memory cells connected to an open word line of the particular block and identifies unerased bits, and copies data for the particular block to a new block if there are more than a minimum number of unerased bits for the open word line.

Additional components of system 100 illustrated in FIG. 3 include media management layer 238, which performs wear leveling of memory cells of non-volatile memory die 108. System 100 also includes other discrete components 240, such as external electrical interfaces, external RAM, resistors, capacitors, or other components that may interface with Controller 122. In alternative embodiments, one or more of the physical layer interface 222, RAID module 228, media management layer 238 and buffer management/bus Controller 214 are optional components that are not necessary in the Controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the flash memory 126 of die 108. The MML 238 may be needed because: 1) the flash memory may have limited endurance; 2) the flash memory 126 may only be written in multiples of pages; and/or 3) the flash memory 126 may not be written unless it is erased as a block. The MML 238 understands these potential limitations of the flash memory 126 which may not be visible to the host. Accordingly, the MML 238 attempts to translate the writes from host into writes into the flash memory 126. As described below, erratic bits may be identified and recorded using the MML 238. This recording of erratic bits can be used for evaluating the health of blocks and/or word lines (the memory cells on the word lines).

Controller 122 may interface with one or more memory dies 108. In in one embodiment, Controller 122 and multiple memory dies (together comprising non-volatile storage system 100) implement a solid state drive (SSD), which can emulate, replace or be used instead of a hard disk drive inside a host, as a NAS device, etc. Additionally, the SSD need not be made to work as a hard drive.

In one embodiment, as discussed below with respect to FIGS. 7-12B, Controller 122 determines candidate bad blocks to test for usability based on previously recorded error codes, causes testing of the candidate bad blocks for usability, and causes storage of information in candidate blocks determined to be still usable.

Figure 4:
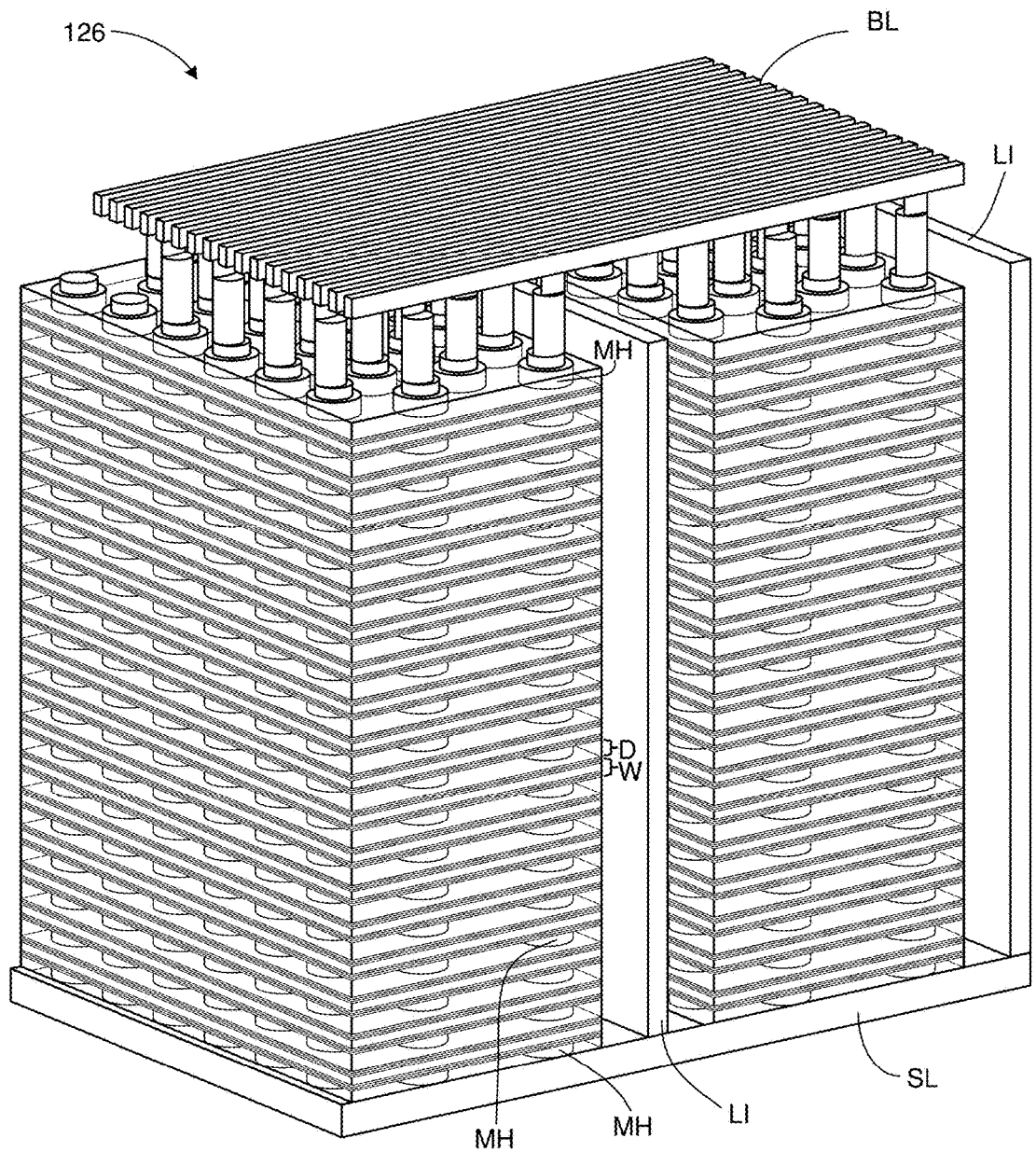
FIG. 4 is a perspective view of a portion of one embodiment of a three dimensional monolithic memory structure.

FIG. 4 is a perspective view of a portion of one example embodiment of a monolithic three dimensional memory structure 126, which includes a plurality memory cells. For example, FIG. 4 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or less than 108-216 layers can also be used. As will be explained below, the alternating dielectric layers and conductive layers are divided into four "fingers" by local interconnects LI. FIG. 4 only shows two fingers and two local interconnects LI. Below and the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data. More details of the three dimensional monolithic memory structure 126 is provided below with respect to FIG. 4A-4F.

Figure 4A:
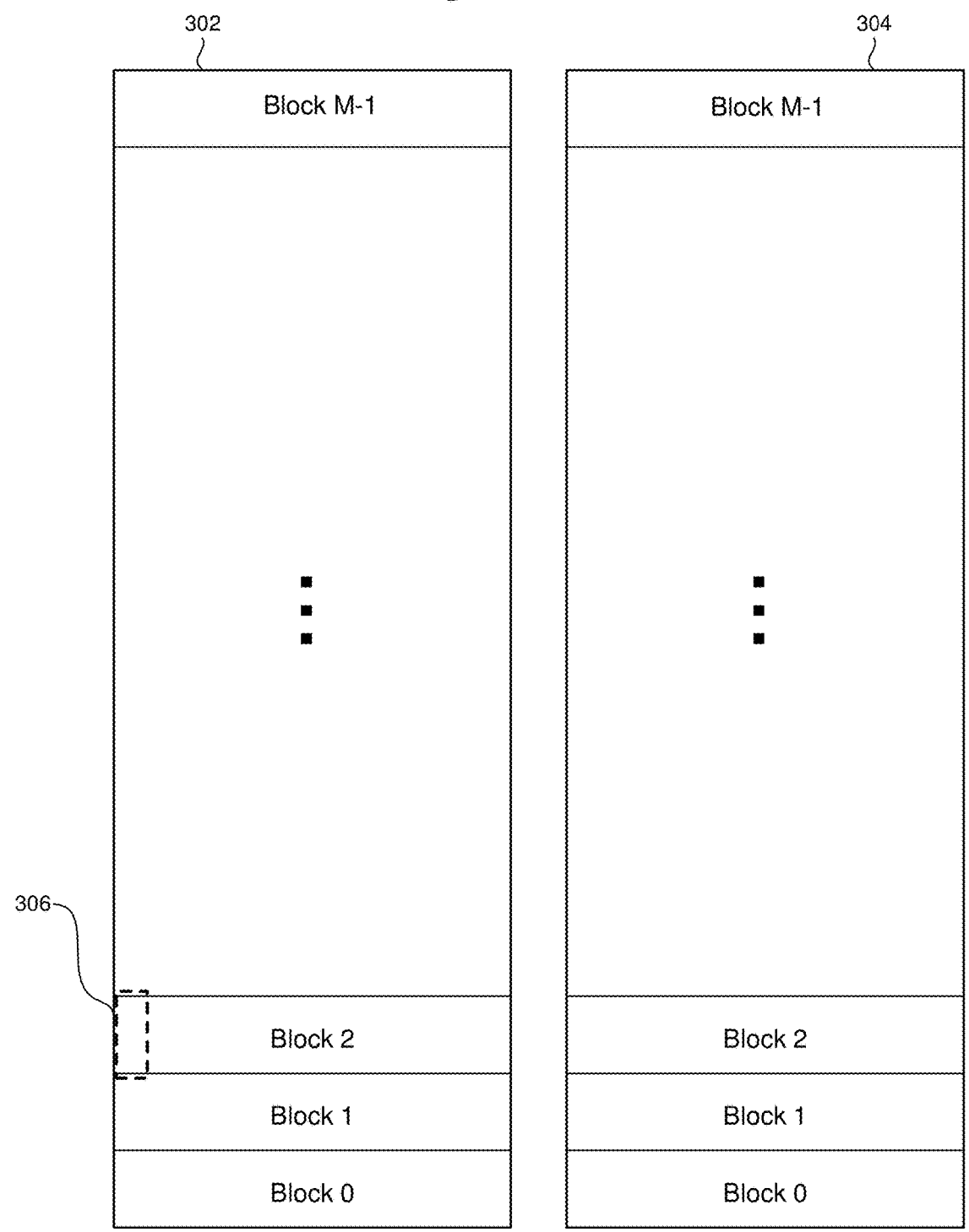
FIG. 4A is a block diagram of a memory structure having two planes.

FIG. 4A is a block diagram explaining one example organization of memory structure 126, which is divided into two planes 302 and 304. Each plane is then divided into M blocks. In one example, each plane has about 2000 blocks. However, different numbers of blocks and planes can also be used. In one embodiment, for two plane memory, the block IDs are usually such that even blocks belong to one plane and odd blocks belong to another plane; therefore, plane 302 includes block 0, 2, 4, 6, . . . and plane 304 includes blocks 1, 3, 5, 7, . . . . In on embodiment, a block of memory cells is a unit of erase. That is, all memory cells of a block are erased together. In other embodiments, memory cells can be grouped into blocks for other reasons, such as to organize the memory structure 126 to enable the signaling and selection circuits.

Figure 4B:
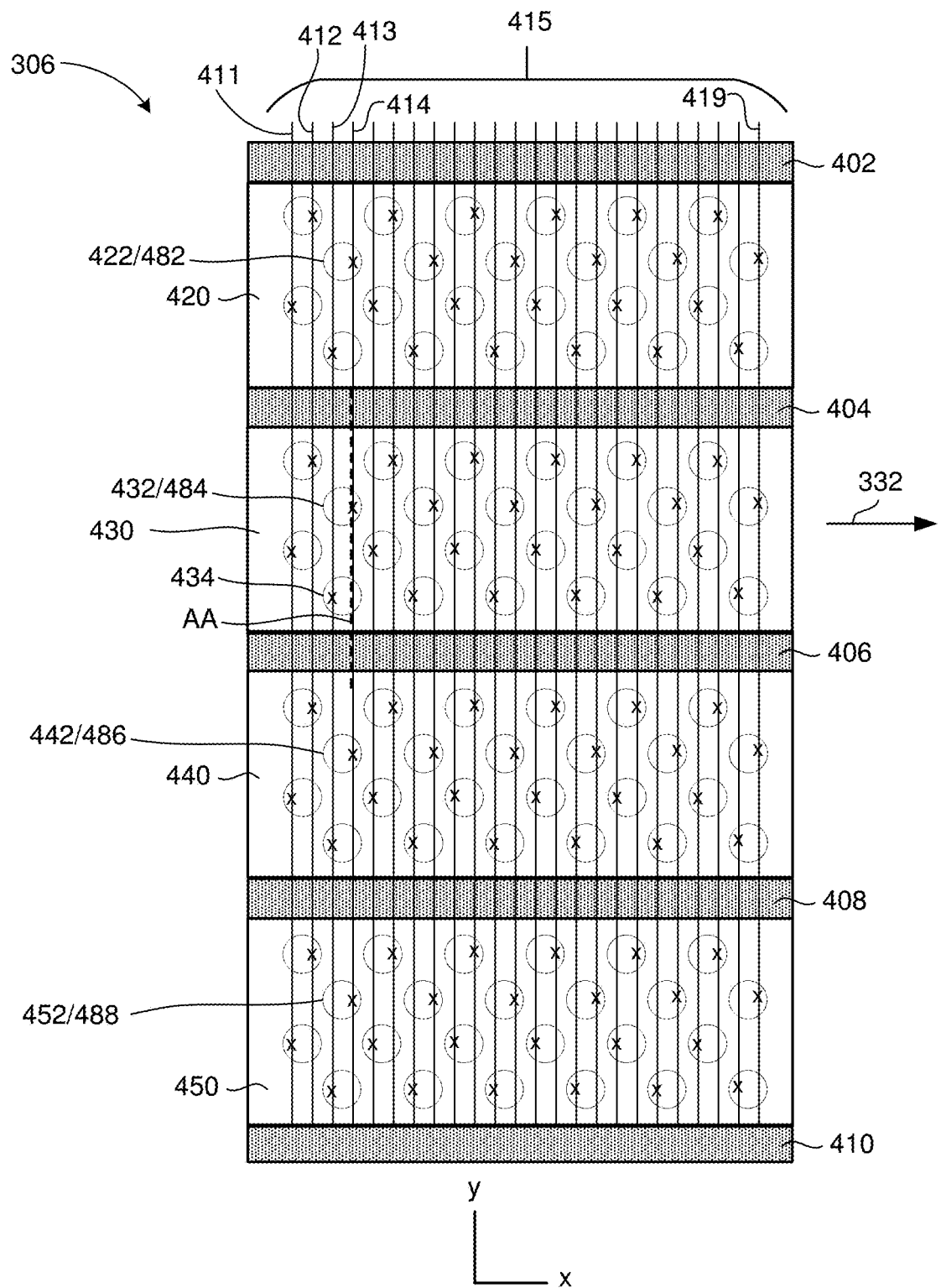
FIG. 4B depicts a top view of a portion of a block of memory cells.

FIGS. 4B-4F depict an example 3D NAND structure. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array will have 60 layers. Other embodiments have less than or more than 60 layers. However, FIG. 4B only shows the top layer.

FIG. 4B depicts a plurality of circles that represent the vertical columns. Each of the vertical columns include multiple select transistors and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 330 and in the direction of arrow 332, the block includes more vertical columns than depicted in FIG. 4B

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
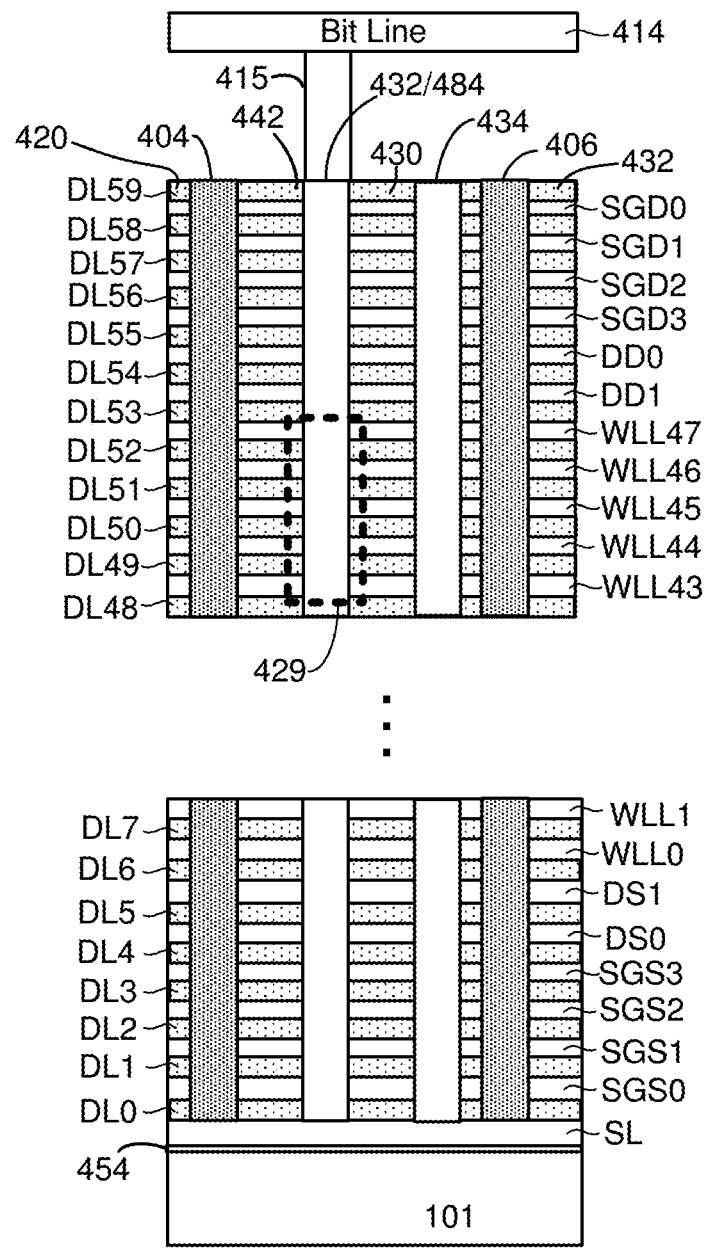
FIG. 4C depicts a cross sectional view of a portion of a block of memory cells.

FIG. 4C depicts a portion of an embodiment of three dimensional memory structure 126 showing a cross-sectional view along line AA of FIG. 4B. This cross sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; four dummy word line layers DD0, DD1, DS0 and DS1; and forty eight data word line layers WLL0-WLL47 for connecting to data memory cells. Other embodiments can implement more or less than four drain side select layers, more or less than four source side select layers, more or less than four dummy word line layers, and more or less than forty eight word line layers (e.g., 96 word line layers). Vertical columns 432 and 434 are depicted protruding through the drain side select layers, source side select layers, dummy word line layers and word line layers. In one embodiment, each vertical column comprises a NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 415. Local interconnects 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0 and DS1; and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL59. For example, dielectric layers DL49 is above word line layer WLL43 and below word line layer WLL44. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layer WLL0-WLL47 connect to memory cells (also called data memory cells). Dummy word line layers DD0, DD1, DS0 and DS1 connect to dummy memory cells. A dummy memory cell does not store host data (data provided from the host, such as data from a user of the host), while a data memory cell is eligible to store host data. Drain side select layers SGD0, SGD1, SGD2 and SGD3 are used to electrically connect and disconnect NAND strings from bit lines.

Source side select layers SGS0, SGS1, SGS2 and SGS3 are used to electrically connect and disconnect NAND strings from the source line SL.

Figure 4D:
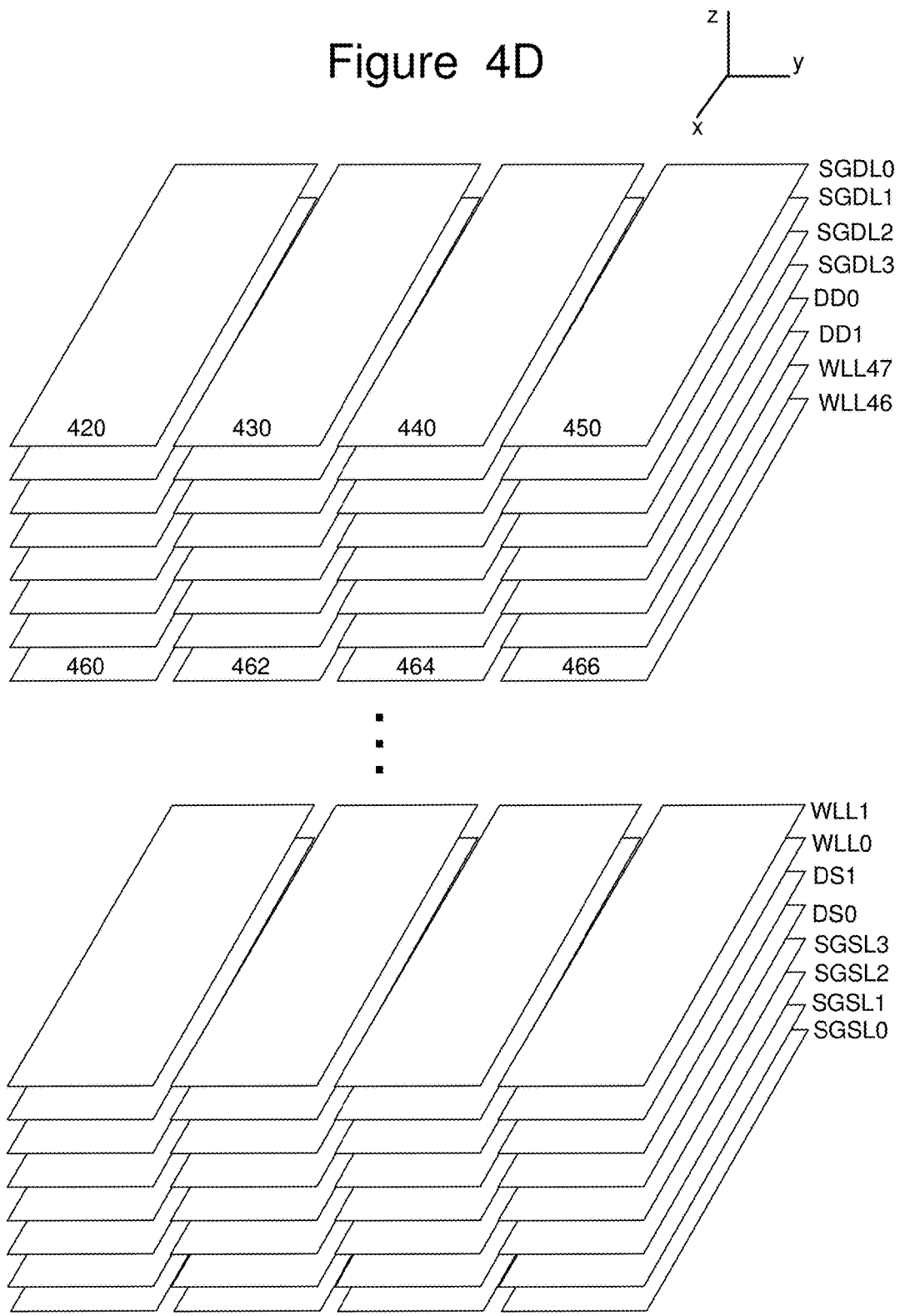
FIG. 4D depicts a view of the select gate layers and word line layers.

FIG. 4D depicts a logical representation of the conductive layers (SGD0, SGD1, SGD2, SGD3, SGS0, SGS1, SGS2, SGS3, DD0, DD1, DS0, DS1, and WLL0-WLL47) for the block that is partially depicted in FIG. 4C. As mentioned above with respect to FIG. 4B, in one embodiment local interconnects 402, 404, 406, 408 and 410 break up each conductive layers into four regions or fingers. For example, word line layer WLL31 is divided into regions 460, 462, 464 and 466. For word line layers (WLL0-WLL31), the regions are referred to as word line fingers; for example, word line layer WLL46 is divided into word line fingers 460, 462, 464 and 466. In one embodiment, the four word line fingers on a same level are connected together. In another embodiment, each word line finger operates as a separate word line.

Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

Figure 4E:
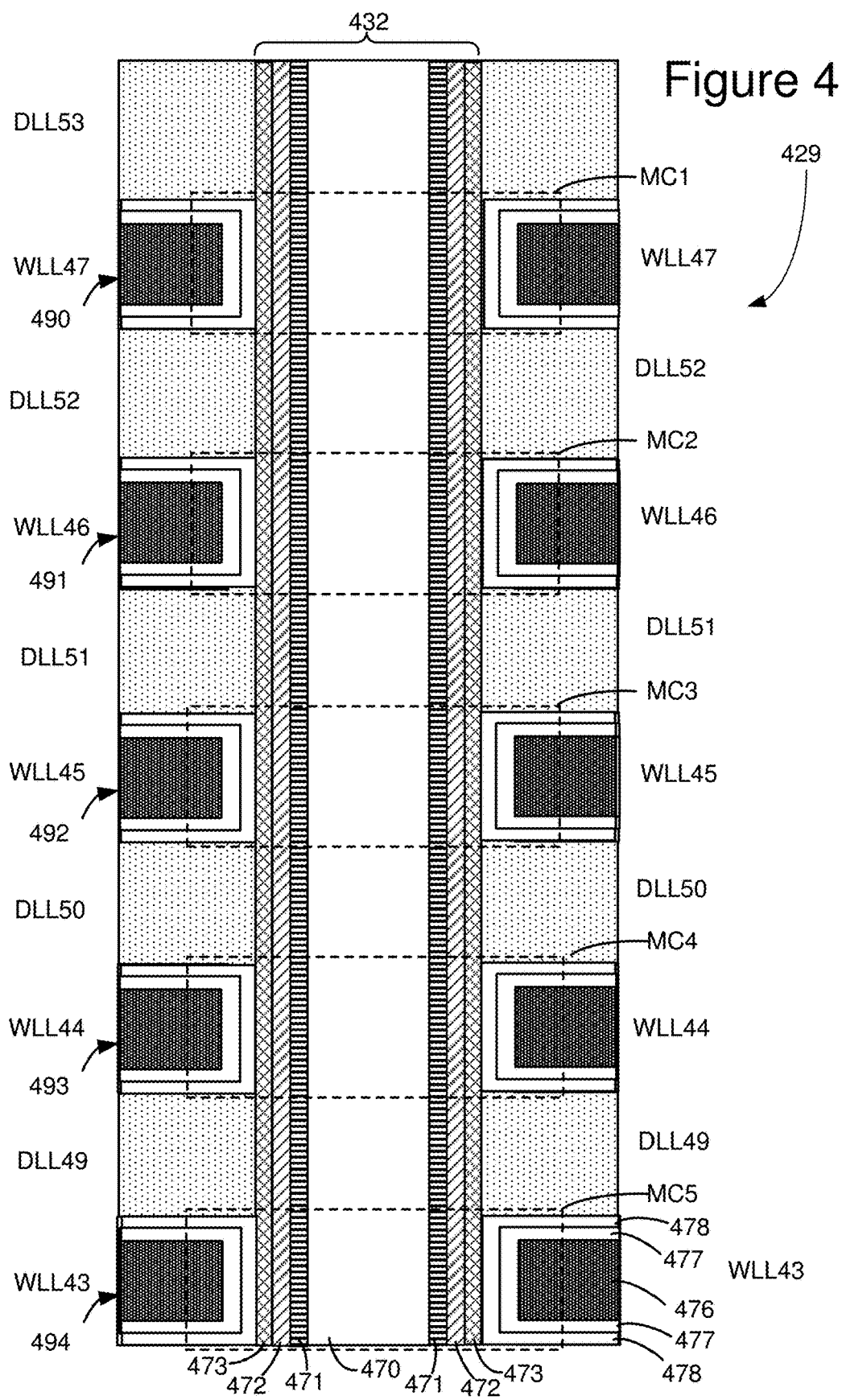
FIG. 4E is a cross sectional view of a vertical column of memory cells.

FIG. 4E depicts a cross sectional view of region 429 of FIG. 4C that includes a portion of vertical column 432. In one embodiment, the vertical columns are round and include four layers; however, in other embodiments more or less than four layers can be included and other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4E depicts dielectric layers DLL49, DLL50, DLL51, DLL52 and DLL53, as well as word line layers WLL43, WLL44, WLL45, WLL46, and WLL47. Each of the word line layers includes a word line region 476 surrounded by an aluminum oxide layer 477, which is surrounded by a blocking oxide ($SiO_2$) layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 4F:
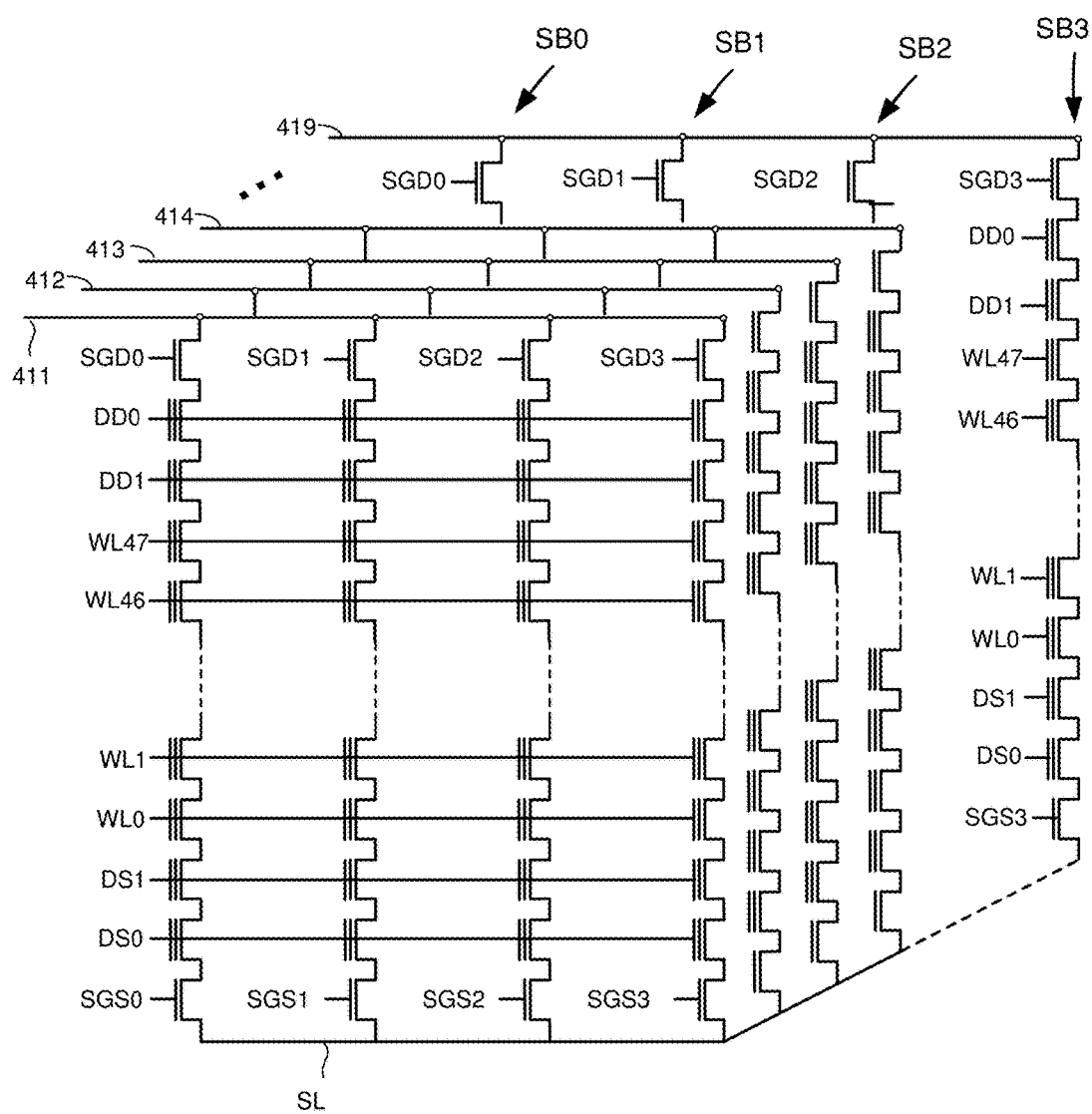
FIG. 4F is a schematic of a plurality of NAND strings.

FIG. 4F shows physical word lines WLL0-WLL47 running across the entire block. The structure of FIG. 4G corresponds to portion 306 in Block 2 of FIGS. 4A-F, including bit lines 411, 412, 413, 414, . . . 419. Within the block, each bit line connected to four NAND strings. Drain side selection lines SGD0, SGD1, SGD2 and SGD3 are used to determine which of the four NAND strings connect to the associated bit line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Although the example memory system of FIGS. 4-4F is a three dimensional memory structure that includes vertical NAND strings with charge-trapping material, other (2D and 3D) memory structures can also be used with the technology described herein. For example, floating gate memories (e.g., NAND-type and NOR-type flash memory ReRAM memories, magnetoresistive memory (e.g., MRAM), and phase change memory (e.g., PCRAM) can also be used.

One example of a ReRAM memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCRAM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

Figure 5A:
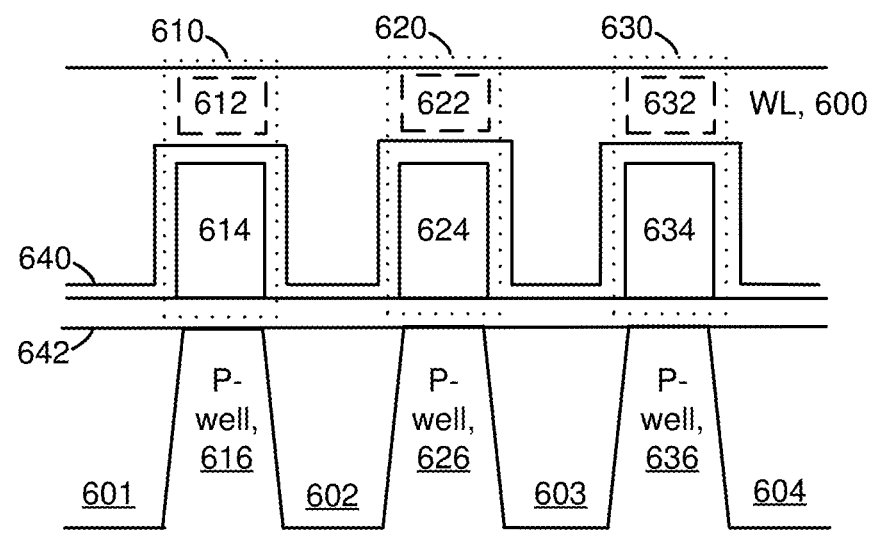
FIG. 5A depicts a cross section of multiple NAND strings in a 2D memory structure.
Figure 5B:
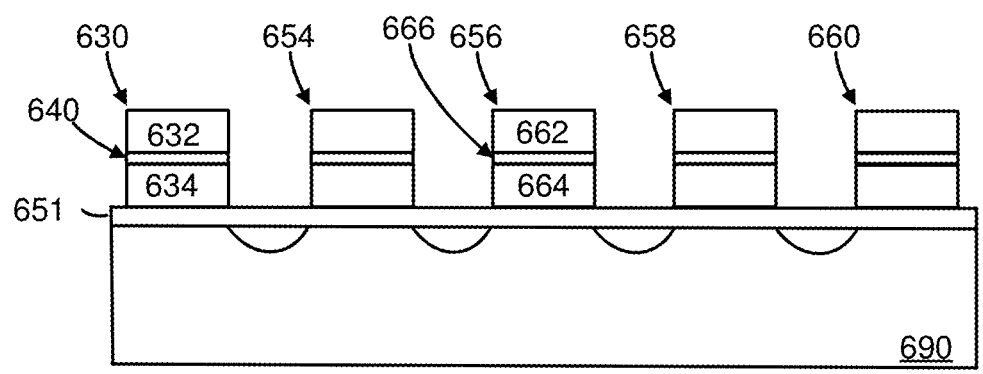
FIG. 5B depicts a cross section of a NAND string in a 2D memory structure.

As discussed above, FIGS. 4-4F disclose a three dimensional memory structure that can be used with the technology proposed herein. FIGS. 5A and 5B depicts the structure of memory cells of a two dimensional memory structure that can be used with the technology proposed herein.

FIG. 5A depicts a cross-sectional view in a word line direction of memory cells comprising floating gates as a 2D example of memory cells in the memory structure 126 of FIG. 2. The cross section depicts a control gate (CG) or word line 600 which extends across multiple memory cells in a word line direction. Each memory cell includes a control gate and a floating gate (FG) which is over a respective channel area of the substrate, typically in a p-well. For example, memory cells 610, 620 and 630 include control gates 612, 622 and 632, respectively, and floating gates 614, 624 and 634, over p-well channel regions 616, 626 and 636, respectively. Each channel region is part of a NAND string which can be visualized as coming out of the page, in a bit line direction which is orthogonal to the word line direction. The p-well regions are separated by shallow trench isolation regions 601, 602, 603 and 604. An inter-poly dielectric (IPD) material 640 may be provided between each control gate and floating gate, while a tunnel oxide layer 642 is provided between each floating gate and a substrate region.

FIG. 5B depicts a cross-sectional view of one of the NAND strings of FIG. 5A. The NAND string includes example memory cells 630, 654, 656, 658 and 660 formed on a tunnel oxide 651 on substrate 690. Each of the memory cells includes a control gate, floating gate and inter-poly dielectric (IPD). For example, memory cell 630 has a control gate 632, IPD 640 and floating gate 634; and memory cell 656 has a control gate 662, IPD 666 and floating gate 664.

Figures 6, 7:
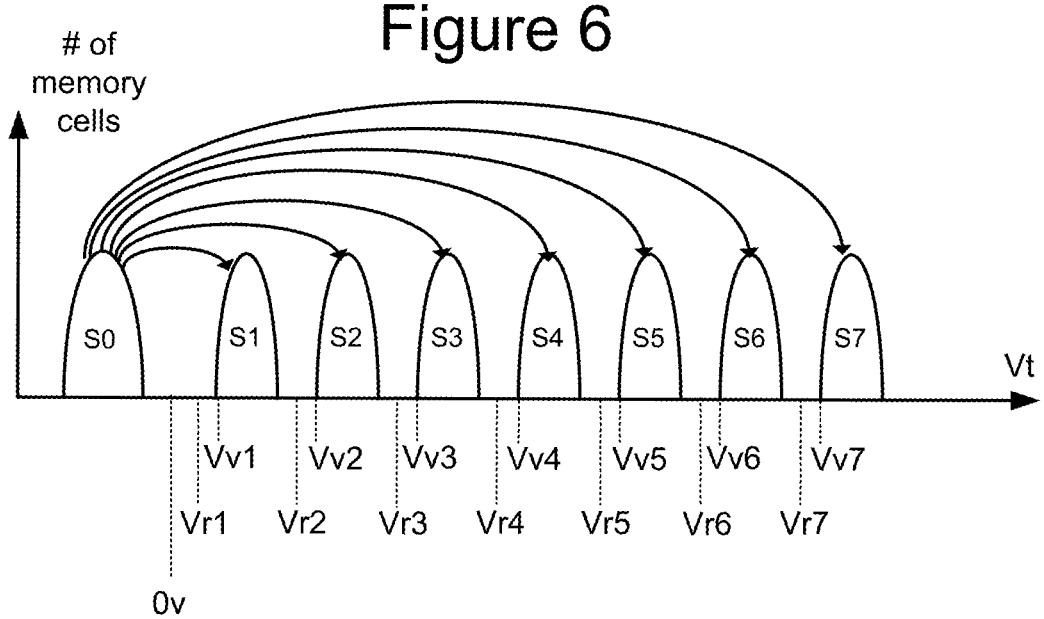
FIG. 6 depicts threshold voltage distributions.
FIG. 7 is a table describing one example of an assignment of data values to data states.

At the end of a successful programming process (with verification), the threshold voltages of the memory cells should be within one or more distributions of threshold voltages for programmed memory cells or within a distribution of threshold voltages for erased memory cells, as appropriate. FIG. 6 illustrates example threshold voltage distributions for the memory cell array when each memory cell stores three bits of data. Other embodiments, however, may use other data capacities per memory cell (e.g., such as one, two, four, or five bits of data per memory cell). FIG. 6 shows eight threshold voltage distributions, corresponding to eight data states. The first threshold voltage distribution (data state) S0 represents memory cells that are erased. The other seven threshold voltage distributions (data states) S1-S17 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory cell erroneously shifts to its neighboring physical state, only one bit will be affected.

FIG. 6 also shows seven read reference voltages, Vr1, Vr2, Vr3, Vr4, Vr5, Vr6, and Vr7, for reading data from memory cells. By testing whether the threshold voltage of a given memory cell is above or below the seven read reference voltages, the system can determine what data state (i.e., S0, S1, S2, S3, . . . ) the memory cell is in.

FIG. 6 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 6 represent the full sequence programming. The technology described herein can also be used with other types of programming in addition to full sequence programming (including, but not limited to, multiple stage/phase programming) In some embodiments, data states S1-D7 can overlap, with Controller 122 relying on ECC to identify the correct data being stored.

FIG. 7 is a table describing one example of an assignment of data values to data states. In the table of FIG. 7, S0=111, S1=110, S2=200, S3=000, S4=010, S5=011, S6=001 and S7=101. Other encodings of data can also be used. No particular data encoding is required by the technology disclosed herein.

In one embodiment, when a block is subjected to an erase operation, all memory cells are moves to data state S0, the erased state. In the embodiment of FIG. 7, all bits stored in a memory cell are 1 when the memory cells is erased (e.g., in data state S0). If an erased memory cell is subjected to read disturb, it is possible that the memory cell may have its threshold voltage moved to a value above Vr1, which would cause the lower page data bit to flip from 1 to 0, which is an error.

Figure 8A:
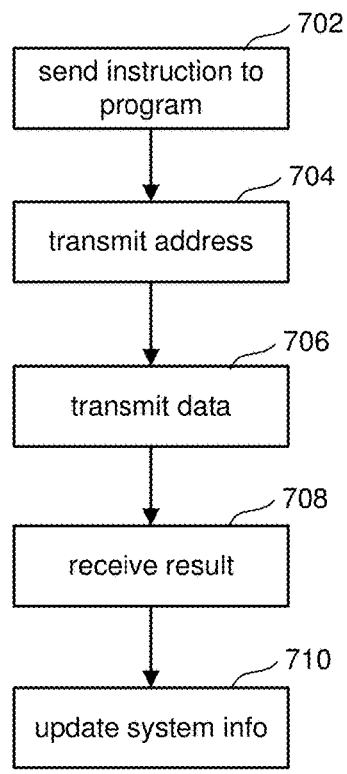
FIG. 8A is a flow chart describing one embodiment of a process for programming.

FIG. 8A is a flowchart describing one embodiment of a process for programming that is performed by Controller 122. In some embodiments, rather than have a dedicated Controller, the host can perform the functions of the Controller. In step 702, Controller 122 sends instructions to one or more memory die 108 to program data. In step 704, Controller 122 sends one or more logical addresses to one or more memory die 108. The one or more logical addresses indicate where to program the data. In step 706, Controller 122 sends the data to be programmed to the one or more memory die 108. In step 708, Controller 122 receives a result of the programming from the one or more memory die 108. Example results include that the data was programmed successfully, an indication that the programming operation failed, and indication that the data was programmed but at a different location, or other result. In step 710, in response to the result received in step 708, Controller 122 updates the system information that it maintains. In one embodiment, the system maintains tables of data that indicate status information for each block. This information may include a mapping of logical addresses to physical addresses, which blocks/word lines are open/closed (or partially opened/closed), which blocks/word lines are bad, etc.

In some embodiments, before step 702, Controller 122 would receive host data and an instruction to program from the host, and the Controller would run the ECC engine 224 to create code words from the host data, as known in the art. These code words are the data transmitted in step 706. Controller can also scramble the data to achieve wear leveling with respect to the memory cells.

Figure 8B:
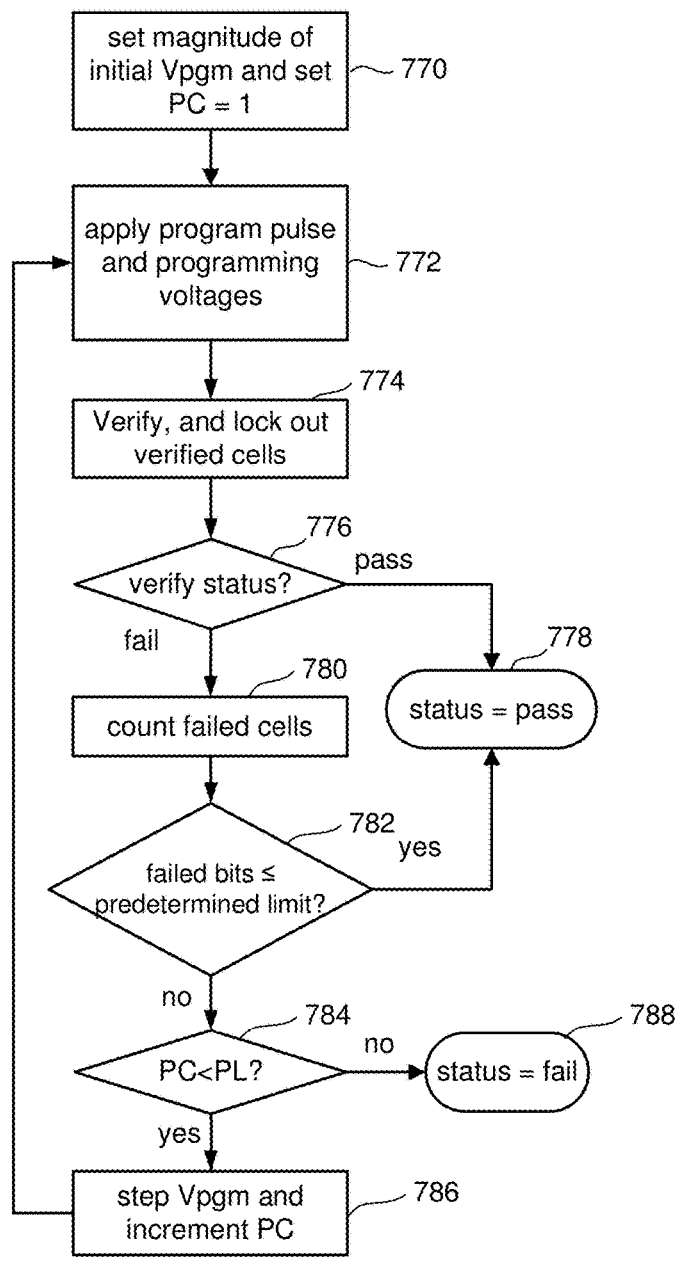
FIG. 8B is a flow chart describing one embodiment of a process for programming.

FIG. 8B is a flowchart describing one embodiment of a process for programming. The process of FIG. 8B is performed by the memory die in response to the steps of FIG. 8A (i.e., in response to the instructions, data and addresses from Controller 122). In one example embodiment, the process of FIG. 8B is performed on memory die 108 using the one or more control circuits discussed above, at the direction of state machine 112. The process of FIG. 8B can also be used to implement the full sequence programming discussed above. Additionally, the process of can be used to implement each phase of a multi-phase programming process.

Typically, the program voltage applied to the control gates (via a selected word line) during a program operation is applied as a series of program pulses. Between programming pulses are a set of verify pulses to perform verification. In many implementations, the magnitude of the program pulses is increased with each successive pulse by a predetermined step size. In step 770 of FIG. 8B, the programming voltage (Vpgm) is initialized to the starting magnitude (e.g., ~12-16V or another suitable level) and a program counter PC maintained by state machine 112 is initialized at 1. In step 772, a program pulse of the program signal Vpgm is applied to the selected word line (the word line selected for programming) In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming In step 772, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 774, the appropriate memory cells are verified using the appropriate set of verify reference voltages to perform one or more verify operations. In one embodiment, the verification process is performed by applying the testing whether the threshold voltages of the memory cells selected for programming have reached the appropriate verify reference voltage.

In step 776, it is determined whether all the memory cells have reached their target threshold voltages (pass). If so, the programming process is complete and successful because all selected memory cells were programmed and verified to their target states. A status of "PASS" is reported in step 778. If, in 776, it is determined that not all of the memory cells have reached their target threshold voltages (fail), then the programming process continues to step 780.

In step 780, the system counts the number of memory cells that have not yet reached their respective target threshold voltage distribution. That is, the system counts the number of memory cells that have, so far, failed the verify process. This counting can be done by the state machine, the Controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 782, it is determined whether the count from step 780 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 778. In this situation, enough memory cells programmed correctly such that the few remaining memory cells that have not been completely programmed can be corrected using ECC during the read process. In some embodiments, step 780 will count the number of failed cells for each sector, each target data state or other unit, and those counts will individually or collectively be compared to a threshold in step 782.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 784 and the program counter PC is checked against the program limit value (PL). Examples of program limit values include 20 and 30; however, other values can be used. If the program counter PC is not less than the program limit value PL, then the program process is considered to have failed and a status of FAIL is reported in step 788. If the program counter PC is less than the program limit value PL, then the process continues at step 786 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 786, the process loops back to step 772 and another program pulse is applied to the selected word line so that another iteration (steps 772-786) of the programming process of FIG. 8B is performed.

In one embodiment, data is programmed in units of pages. So, for example, the process of FIG. 8B is used to program one page of data. Because it is possible that errors can occur when programming or reading, and errors can occur while storing data (e.g., due to electrons drifting, data retention issues or other phenomenon), error correction is used with the programming of a page of data. Many ECC coding schemes are well known in the art.

Step 774 of FIG. 8B includes performing verification. The process of verifying includes performing various sensing operations that include applying a verify compare voltage (e.g., Vv1, Vv2, Vv3, . . . ) on the selected word line to determine whether selected memory cells have a threshold voltage less than or greater than the verify compare voltage. Because the selected word line can be connected to selected memory cells and unselected memory cells, it is possible that the application of the verify compare voltage can cause unselected memory cells connected to the selected word line (thereby receiving the verify compare voltage) to a change in threshold voltage. This is read disturb. To prevent read disturb during the verify operations, the memory system boosts the channels of unselected NAND strings by applying a boosting voltage (referred to as Vread) to unselected word lines. As a result, the channels of unselected NAND strings boost up to a positive voltage, which reduces the voltage differential between the channel and the control gates, thereby reducing the change of a read disturb.

As discussed above, a word line is closed if all pages on that word line have been programmed and a word line is open if all memory cells connected to the word line are in (or supposed to be in) the erased condition. Thus, a block is an open block if one or more of the word lines in that block are closed and if one or more of the word lines in that block are open. A block is closed if all word lines in that block are closed.

FIG. 9 depicts a block of memory cells 850. Depicted in the block 850 are a set of word lines 852, 854, 856, 858, 860, 862, 864, 866, 868, 870 and 872. Each word line is depicted as a rectangle, representing the memory cells connected to that word line. Inside each rectangle is an indication of whether the memory cells have been subjected to programming (Programmed) or have not been programmed yet (Not Programmed). As can be seen, word lines 852-864 have been subjected to programming and those word lines are considered closed word lines. Word lines 866-872 have not been programmed; therefore, those word lines are open word lines. Word line 864 is a boundary word line because it is a closed word line that is adjacent an open neighbor word line 866. Word line 852 is an edge word line because it is a closed word line next to an open dummy word line. FIG. 10 depicts block 876 having word lines 878, 880, 882, 884, 886, 888, 890, 892, 894, 896 and 898. All of word lines 878-898 have received programming (Programmed); therefore, word lines 878-898 are all closed word lines and block 876 is a closed block. FIGS. 9 and 10 only show user data word lines.

It has been determined that reading memory cells connected to closed word lines in an open block can cause read disturb to memory cells connected to open word lines of the same block. Therefore, technology is proposed for detecting read disturb in open blocks. If the number of errors caused by the read disturb is greater than a limit, then the system takes an action to mitigate the read disturb.

Figure 11:
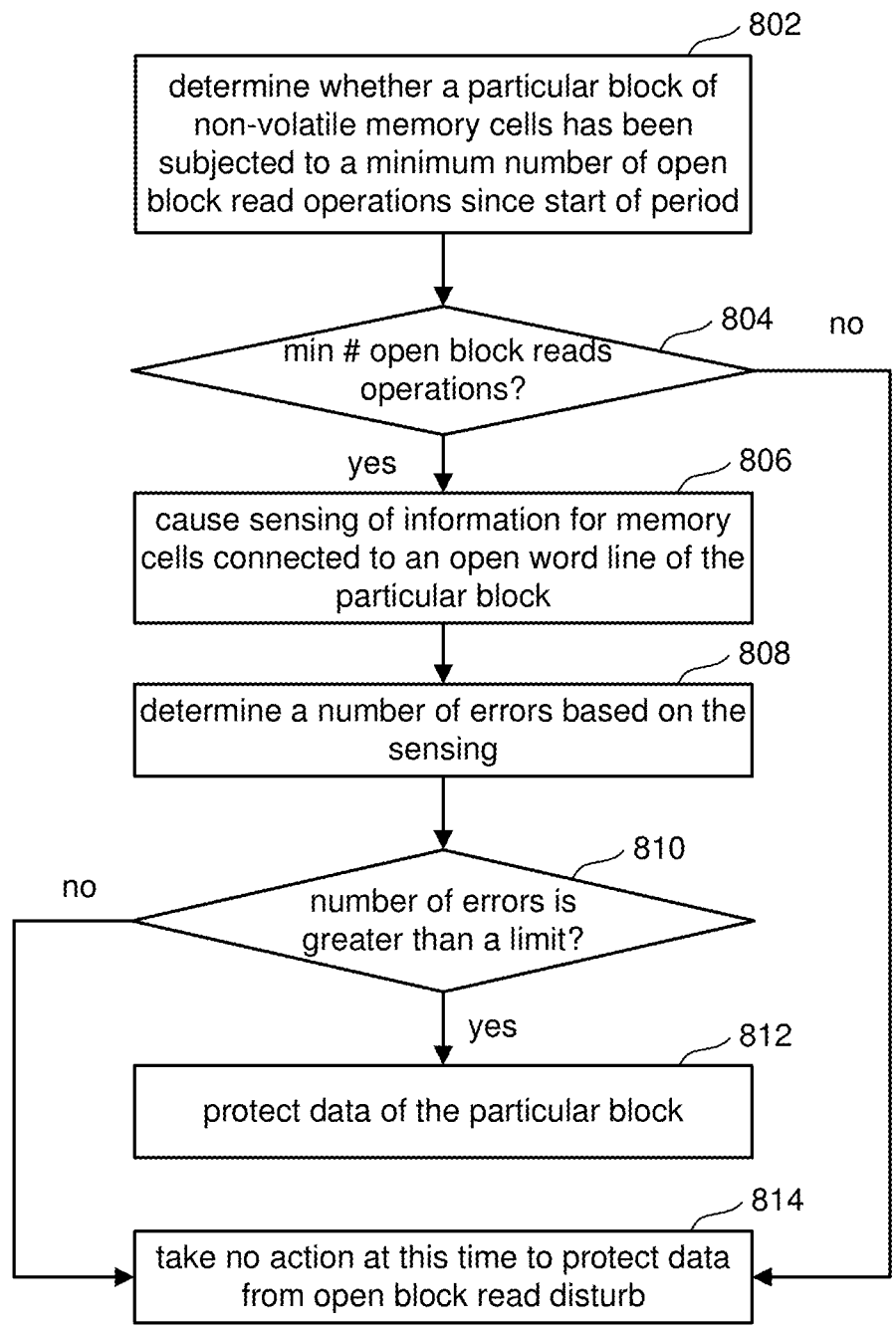
FIG. 11 is a flow chart describing one embodiment of a process for detecting read disturb and mitigating the effects of read disturb.

FIG. 11 is a flow chart describing one embodiment of a process for detecting read disturb and mitigating the effects of read disturb. The process of FIG. 11 can be performed by any one or combination of the one or more control circuits discussed above. For example, the process of FIG. 11 can be performed by and/or at the direction of Controller 122 or state machine 112.

In step 802, the one or more control circuits determine whether a particular block of non-volatile memory cells have been subjected to a minimum number of open block read operations since the start of a particular period. That period can be define as since a counter (e.g., counter of memory operations, program-erase cycles, etc.) started or time since a timer has started (e.g., a number of hours, a number of days, etc). In one embodiment, the system keeps a count of open block read operations that is reset after the counter reaches a threshold, so the particular period of step 802 is the period since the counter was last reset. In step 804, the one or more control circuits determine whether a minimum number (and/or predefined number) of open block read operations have been performed for that particular block. If so, then in step 806, the one or more control circuits cause the sensing of information from memory cells connected to an open word line of the particular block. The open word line sensed in step 806 can include an open word line that is next to a boundary word line, the last open word line in a block or a random open word line. The sensing in step 806 can include performing a standard read operation to obtain the data stored in memory cells. Alternatively, the system can determine whether the memory cells have a threshold voltage greater than a compare value.

In step 808, the one or more controls determine the number of errors based on the sensing of step 806. If a standard read operation was performed in step 806, then any memory cell that is not in data state S0 has an error. Alternatively, the system can count the number of data 0's from the read operation. Alternatively, if one or more control circuits are testing whether the memory cells have a threshold voltage greater than a compare value (e.g., 0 v), then all memory cells that do have that threshold voltage greater than that compare value are considered to be an error. Step 808 includes counting up the number of errors. In step 810, the one or more control circuits determine whether the number of errors is greater than a limit (e.g., a predefined number representing the maximum number of errors allowed). If the number of errors is greater than the limit, then in step 812 the one or more control circuits take measures to protect the data of the particular block under consideration. If the number of errors is not greater than the limit, then (step 814) the one or more control circuits take no action at this time to protect the data from the open block read disturb. The reason why step 810 includes comparing the number of errors to some limit, rather than protecting the data if there are any amount of errors, is that a small number of errors can be tolerated and fixed (dealt with) using the error correction process (see ECC module 224, FIG. 3).

If, in step 804, the number of open block read operations has not reached a minimum number, then the process of FIG. 11 proceeds from step 804 directly to step 814 and no action is taken at this time to protect the data from open block read disturb.

Figure 12:
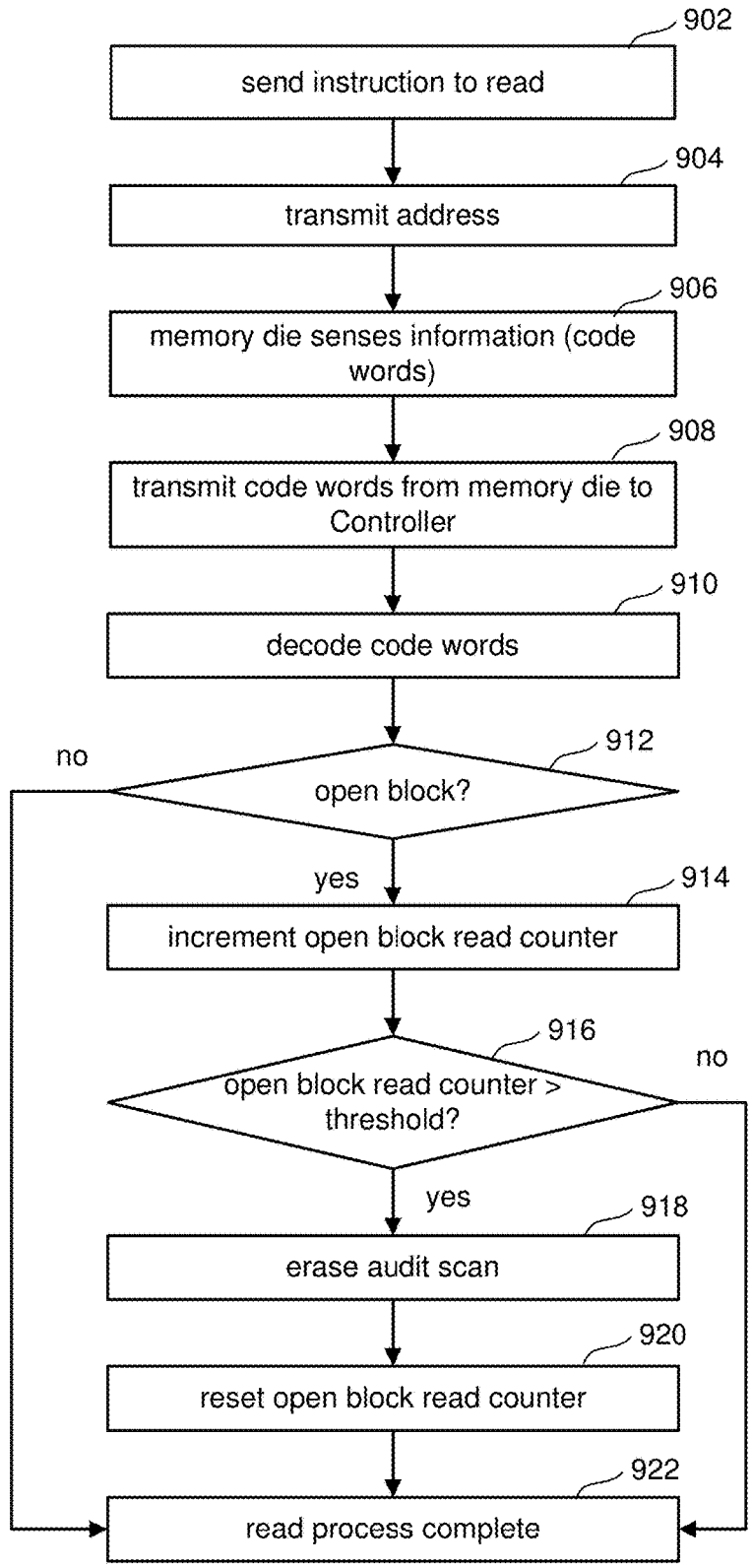
FIG. 12 is a flow chart describing one embodiment of a process for reading that includes detecting read disturb and mitigating the effects of read disturb.

FIG. 12 is a flow chart describing one embodiment of a process for reading that includes detecting read disturb and mitigating the effects of read disturb. FIG. 12 provides an example implementation with more details of the process of FIG. 11. The process of FIG. 12 can be performed by any combination of the one or more control circuits. In one embodiment, the process of FIG. 12 is performed by and/or at the direction of Controller 122. In step 902 of FIG. 12, Controller 122 sends instructions to one of the memory die 108 to perform a read operation. In step 904, Controller 122 sends the address for that read operation to memory die 108. In step 906, memory die 108 performs sensing of the memory cells connected to the addressed word line for the read operation. The read operation may require multiple sensing operations. In one embodiment, the one or more sensing operations provides a set of code words, which represents include original host data after being subjected to error correction codes. In step 908, memory die 108 transmits the code words to Controller 122. In step 910, Controller 122 decodes the code words using the ECC process.

In step 912, Controller 122 determines whether the block being read is an open block. If not, the process continues to step 922 and the read process is complete. However, if the block being read is an open block, then in step 914 an open block read counter 236 (see FIG. 3) is incremented. In step 916, the open block read counter 236 is compared to a threshold number (e.g., 1,000 reads since the counter was last reset). If the open block read counter is greater than the threshold number then the process of FIG. 12 continues at step 918. If the open block read counter is not greater than the threshold, then the process continues to step 922 and the read process is complete. In another embodiment, rather than to determine whether there have been 1,000 open block reads since the last time the open block read counter has been reset (e.g., the period), the system can test whether it has been X hours, Y days, etc. since counting. Note that the test for whether the block has been subjected to a minimum number of open block read operations was performed in response to performing the read operation for that same block (see step 906 above).

In step 918, the system will perform an erase audit scan, which tests for open block read disturb. Step 918 includes Controller 122 choosing an open word line to be scanned and running the erase audit scan against that chosen open word line. The erased audit scan of can be performed on an open word line that is adjacent to a boundary word line, the last open word line in a block, or a random open word line. More details of the erase audit scan are provided below with respect to FIG. 14. After performing the erase audit operation of step 918, Controller 122 resets the open block read counter 236 and the process of FIG. 12 is complete (step 922).

Figure 13:
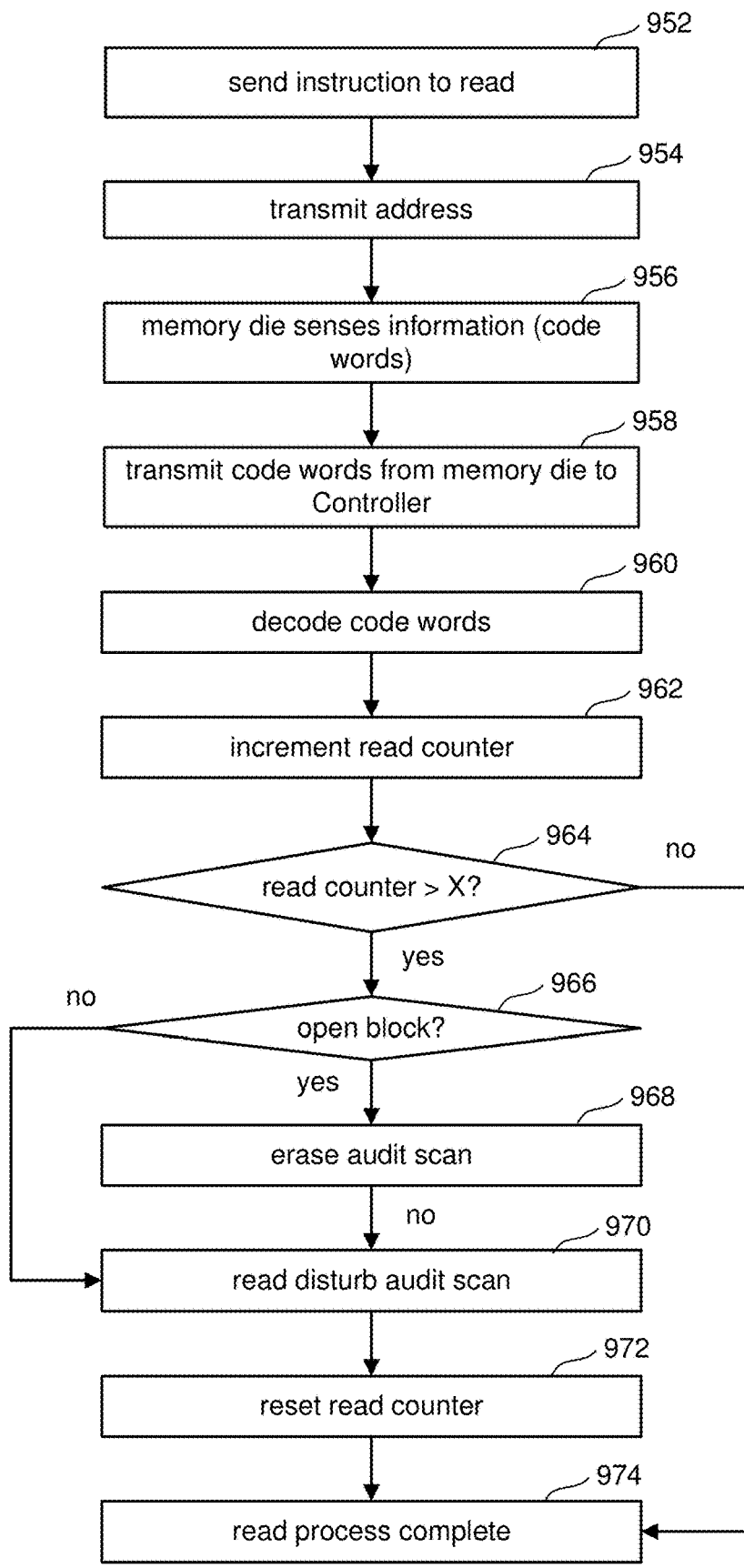
FIG. 13 is a flow chart describing one embodiment of a process for reading that includes detecting read disturb and mitigating the effects of read disturb.

FIG. 13 is a flow chart describing one embodiment of a process for reading that includes detecting read disturb and mitigating the effects of read disturb. The process of FIG. 13 is an alternative embodiment to the process of FIG. 12. The process of FIG. 13 can be performed by any one or a combination of the one or more control circuits. In one embodiment, the process of FIG. 13 is performed by and/or at the direction of Controller 122. The process of FIG. 13 pertains to an embodiment that performs a read disturb audit scan, which is different than the erase audit scan discussed above. The read disturb audit scan includes, in one example, for every N reads the system will measure the bit error rate (BER) on a subset of word lines of a block. If the BER is higher than expected, the system will conclude that there is a possibility of read disturb. This test is performed typically on closed word lines. The process of FIG. 13 uses the mechanism for read disturb audit scan in order to trigger the error audit scan.

In step 952 of FIG. 13, Controller 122 sends instructions to one of the memory die 108 to perform a read operation. In step 954, Controller 122 transmits the address to memory die 108 for that read operation. In step 956, the memory die performs the sensing for the read operation to identify the code words. Those code words would be transmitted back to Controller 122 in step 958. In step 960, Controller 122 decodes the code word using the ECC engine (e.g., ECC module 224). In step 962, Controller 122 increments the read counter 234 (see FIG. 3). If the read counter is greater than some predetermined constant X (step 964) then testing for read disturb will be performed by proceeding to step 966.

In step 966, Controller 122 determines the block under consideration is an open block. If the block is an open block, then an erase audit scan will be performed in step 968 for one of the open word lines in the block. The erased audit scan of can be performed on an open word line that is adjacent to a boundary word line, the last open word line in a block, or a random open word line. More details of the erase audit scan are provided below with respect to FIG. 14. After performing the erase audit scan, the system will perform a read disturb audit scan in step 970.

If the block was not an open block (as determined in step 966), then step 968 is skipped and the system proceed from step 966 directly to step 970 to perform the read disturb audit scan. In step 972, the read counter 234 is reset. In step 974, the read process is complete. If in step 966, it is determined the read counter is not greater than X, then the process will continue directly to step 974 and the read process will be completed without performing the erase audit scan or the read disturb audit scan.

Figure 14:
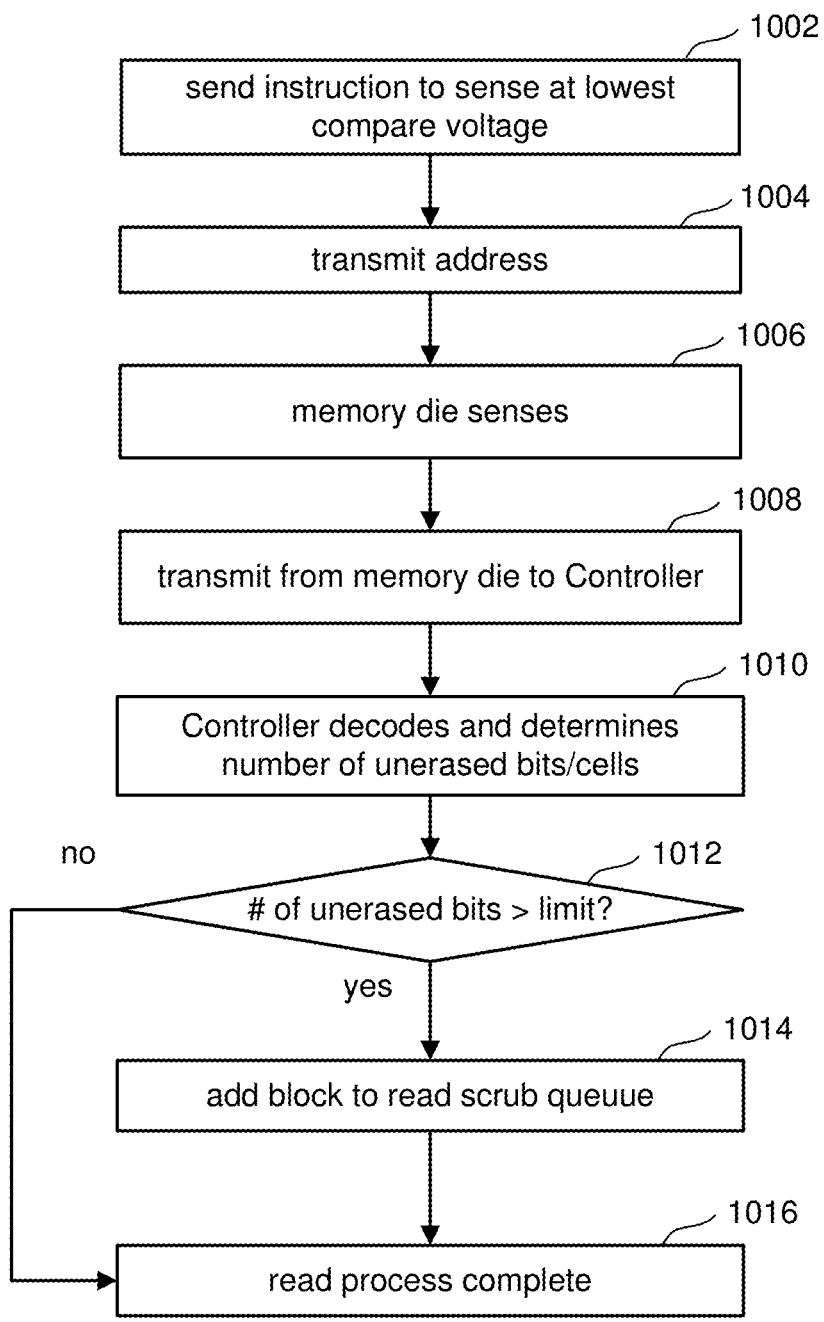
FIG. 14 is a flow chart describing one embodiment of a process for performing an erase audit scan.

FIG. 14 is a flow chart describing one embodiment of a process for performing the erase audit scan (see e.g., step 918 of FIG. 12 and step 968 of FIG. 13). The process of FIG. 14 can be performed by any one or combination of the one or more control circuits. In one embodiment, the process of FIG. 14 is performed by and/or at the direction of Controller 122. The process of FIG. 14 is one example of mitigating the effects of read disturb which includes protecting the data in the block being read. Examples of protecting the data include any one or more of copying all the data for the particular block to a new block, subjecting the data of the block to an error correction process and correcting data, adjusting threshold voltages of memory cells to combat read disturb, and/or other measures as per the particular implementation.

In step 1002 of FIG. 14, Controller 122 sends an instruction to the appropriate memory die 108 to perform a sensing operation at the lowest compare voltage (or a different voltage). Looking back at FIG. 6, one embodiment of the lowest compare voltage is 0 volts, which is a voltage level between data state S0 and data state S1. Thus, in one example of embodiment step 102 includes Controller 122 instructing memory die 108 to perform a sensing operation to determine whether each of the memory cells of the open word line being tested have a threshold voltage greater than 0 volts. In step 1004, Controller 122 transmits the address for the sensing operation of step 1002. For example, step 1004 can include transmitting a page address for the word line being tested.

In step 1006, memory die 108 performs the sensing operation, including testing whether memory cells connected to the open word line under consideration have a threshold voltage greater than the compare voltage. In other embodiments, a standard read operation can be performed. In step 1008, the results of the sensing operation are transmitted from memory die 108 to Controller 122. In step 1010, Controller 122 decodes the data (if necessary) and determines the number of unerased bits or memory cells (ie the number of errors). As discussed above, each memory cell should be in data state S0. Any memory cell not in data state S0 is an error. Alternatively, the system can check for a number of 0's. In one embodiment, each 0 is an error. Each error represents an unerased memory cell or unerased bit of data. In step 1012, the system determines whether the number of unerased bits (or errors) is greater than the limit. This can be the same limit as step 810 in FIG. 11. If the number of unerased or error bits (or memory cells) is greater than the limit, then the block is added to a queue for read scrubs (referred to as the read scrub queue) in step 1014. If the number of unerased or error bits (or memory cells) is not greater than the limit, then the read process is complete (step 1016) without adding the block to read scrub queue.

Figure 15:
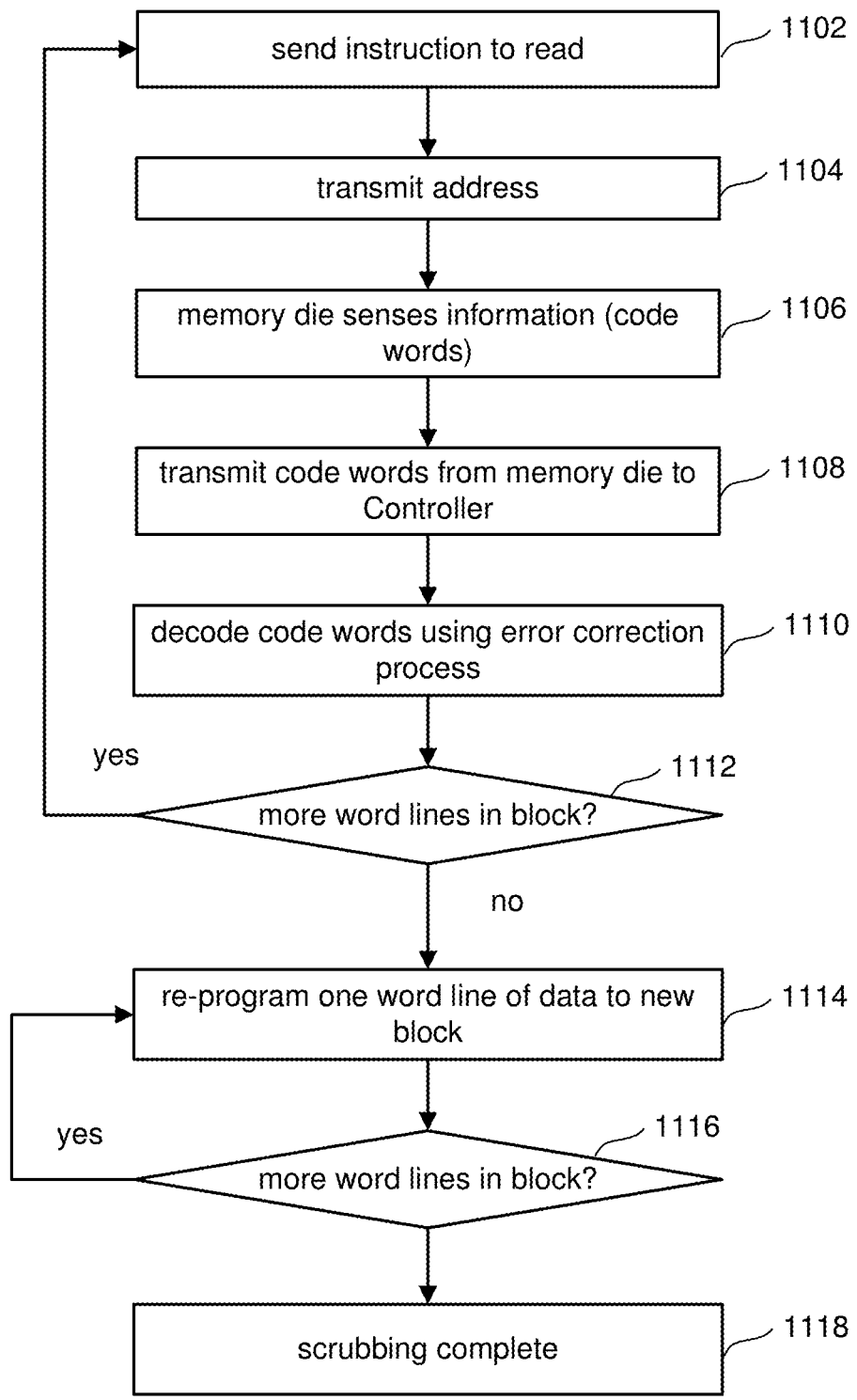
FIG. 15 is a flow chart describing one embodiment for scrubbing data.

FIG. 15 is a flow chart describing one embodiment for scrubbing data, which is one possible implementation for protecting the data. The process of FIG. 15 includes operating on the blocks that were placed into the read scrub queue (see step 1014 of FIG. 14). In one embodiment, each iteration/performance of the process of FIG. 15 includes operating on one of the blocks that was placed into the read scrub queue. Therefore, if there are fifteen blocks in the read scrub queue, the process of FIG. 15 will be performed fifteen times, once for each block in the read scrub queue. The process of FIG. 15 can be performed by any one or a combination of the one or more control circuits. In one embodiment, the process of FIG. 15 is performed by and/or at the direction of Controller 122.

In step 1102, Controller 122 sends instructions to memory die 108 to perform a read operation on the block that is being operated on. In one embodiment, the read operation is to be performed for all memory cells connected to a selected word line. In step 1104, Controller 122 sends an address (e.g., page address for the word line) for the read operation of step 1102. In step 1106, the memory die 108 performs the sensing operation(s) associated with the read instruction from step 1102. In step 1108, the code words that resulted from the sensing operations of step 1106 are transmitted from memory die 108 to Controller 122. In step 1110, Controller 122 decodes the code words received using the error correction process. This may include fixing errors in the data read. In step 1112, Controller 122 determines whether there are any more word lines in the particular block under consideration that have not been read yet. If there are more word lines to read, then the process loops back to step 1102 and begins operating on the next word line. The loop of steps 1102-1112 results in the reading of data from every word line in the block. Once all the data has been read and subjected to the error correction process (ie to fix errors caused by read disturb or other issues), the system can then be ready to reprogram the data to a new block. In step 1114, Controller 122 reprograms one word line of the data to the new block. In one example of implementation, step 1114 is implementing by performing the processes of FIGS. 8A and 8B to program data concurrently to all of the memory cells connected to the selected word line. In step 1116 of FIG. 15, Controller 122 determines whether there are more word lines in the block that need to be re-programed to the new block. If so, the process loops back to step 1114 and programs the next word line of data. If all word lines have been programmed (step 1116), then the scrubbing process of FIG. 15 is complete (step 1118).

One embodiment includes a non-volatile storage apparatus, comprising: a plurality of non-volatile memory cells and one or more control circuits in communication with the memory cells. The one or more control circuits are configured to determine whether a particular block of non-volatile memory cells has been subjected to a minimum number of open block read operations. The one or more control circuits are configured to cause sensing of information for memory cells connected to an open word line of the particular block and determine a number of errors based on the sensing if the particular block has been subjected to a minimum number of open block read operations. The one or more control circuits are configured to protect data of the particular block if the number of errors is greater than a limit One embodiment includes a method of operating non-volatile storage, comprising: determining that a particular block of non-volatile memory cells is an open block and has been subjected to a minimum number of read operations; causing sensing of memory cells connected to an open word line of the particular block; determining a number of unerased memory cells based on the reading; and scrubbing data for the particular block if the number of unerased bits is greater than a limit.

One embodiment includes an apparatus, comprising: an electrical interface to one or more non-volatile memory circuits; and one or more processors connected to the interface and adapted to be in communication with the one or more non-volatile memory circuits. The one or more processor are configured to determine that a particular block of non-volatile memory cells in the one or more non-volatile memory circuits is an open block and has been subjected to a minimum number of read operations since a count started. The one or more processor are configured to cause sensing of memory cells connected to an open word line of the particular block. The one or more processors are configured to calculate a number of error conditions in the sensed memory cells. The one or more processors are configured to scrub data for the particular block if the number of error conditions is greater than a limit.

One embodiment includes a non-volatile storage apparatus, comprising: a plurality of non-volatile memory cells; means for determining that a particular block of non-volatile memory cells is an open block and has been subjected to a minimum number of read operations; means for reading memory cells connected to an open word line of the particular block and identifying unerased bits; and means for copy data for the particular block to a new block if there are more than a minimum number of unerased bits for the open word line.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
a plurality of non-volatile memory cells; and
a control circuit in communication with the memory cells, the control circuit configured to determine that a block of non-volatile memory cells has been subjected to a minimum number of open block read operations, the control circuit further configured to sense memory cells connected to an open word line of the block and to determine a number of errors based on the sensing in response to the block having been subjected to the minimum number of open block read operations, the control circuit configured to scrub data of the block if the number of errors exceeds a limit.

2. A non-volatile storage apparatus according to claim 1, wherein:
the control circuit is configured to determine that the particular block is an open block.

3. A non-volatile storage apparatus according to claim 1, wherein:
the control circuit is configured to determine a number of errors based on the sensing by determining how many memory cells connected to the open word line are not in an erased condition.

4. A non-volatile storage apparatus according to claim 1, wherein:
the control circuit is configured to determine whether the particular block of non-volatile memory cells has been subjected to a minimum number of open block read operations in response to performing a read operation for the particular block.

5. A non-volatile storage apparatus according to claim 1, wherein:
the control circuit is configured to sense information for memory cells connected to an open word line of the particular block by performing a read operation for an open word line that is adjacent a boundary word line.

6. A non-volatile storage apparatus according to claim 1, wherein:
the control circuit maintains different open block read counters for different blocks.

7. A non-volatile storage apparatus according to claim 1, wherein:
the control circuit maintains a read counter for the particular block; and
the control circuit is configured to determine whether the particular block has been subjected to the minimum number of open block read operations by comparing the read counter to a read counter threshold and determining if the particular block is an open block if the read counter is greater than the read counter threshold.

8. A non-volatile storage apparatus according to claim 1, wherein:
the plurality of non-volatile memory cells are positioned on a first integrated circuit; and
the control circuit includes a Controller on a second integrated circuit, the Controller is configured to determine whether the particular block has been subjected to the minimum number of open block read operations.

9. A method of operating non-volatile storage, comprising:
determining that a particular block of non-volatile memory cells is an open block and has been subjected to a minimum number of read operations;
causing sensing of memory cells connected to an open word line of the particular block;
determining a number of unerased memory cells based on the reading; and
scrubbing data for the particular block if the number of unerased memory cells is greater than a limit.

10. A method according to claim 9, wherein:
the determining the number of unerased memory cells based on the reading includes determining a number of memory cells having a threshold voltage greater than a compare value.

11. A method according to claim 9, wherein:
the determining that the particular block of non-volatile memory cells is an open block includes determining that the particular block has at least one word line for which no memory cells connected to the one word line have been subjected to programming since a previous block erase.

12. A method according to claim 9, wherein the scrubbing data comprises:
causing reading all of the data for the particular block, including subjecting the data to an error correction process; and
causing re-programming of the data read for the particular block to a new block.

13. A method according to claim 9, further comprising:
causing reading of data from a plurality of memory cells in the particular block of non-volatile memory cells, the determining that the particular block is an open block and has been subjected to the minimum number of read operations is performed in response to the reading.

14. A method according to claim 13, further comprising:
incrementing an open block read counter if the particular block of memory cells is an open block, the determining that the particular block has been subjected to the minimum number of read operations includes comparing the open block read counter to the threshold.

15. An apparatus, comprising:
an electrical interface to one or more non-volatile memory circuits; and
one or more processors connected to the interface and adapted to be in communication with the one or more non-volatile memory circuits, the one or more processors are configured to determine that a particular block of non-volatile memory cells in the one or more non-volatile memory circuits is an open block and has been subjected to a minimum number of read operations since a count started, the one or more processors are configured to cause sensing of memory cells connected to an open word line of the particular block, the one or more processors are configured to calculate a number of error conditions in the sensed memory cells, the one or more processors are configured to scrub data for the particular block if the number of error conditions is greater than a limit.

16. An apparatus according to claim 15, wherein:

the open word line of the particular block is adjacent a closed word line of the particular block;

the one or more processors are configured to calculate the number of error conditions in the sensed memory cells by determining how many of the memory cells connected to the open word line have a threshold voltage greater than a compare voltage; and the one or more processors are configured to scrub data for the particular block by re-programming all programmed data for the particular block.

* * * * *